(12) United States Patent
Nagata et al.

(10) Patent No.: US 11,703,551 B2
(45) Date of Patent: Jul. 18, 2023

(54) MAGNETIC FIELD DETECTION DEVICE

(71) Applicant: TDK CORPORATION, Tokyo (JP)

(72) Inventors: Masaki Nagata, Tokyo (JP); Kazuya Watanabe, Tokyo (JP); Keisuke Uchida, Tokyo (JP); Kohei Honma, Tokyo (JP); Hiraku Hirabayashi, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 17/729,149

(22) Filed: Apr. 26, 2022

(65) Prior Publication Data

US 2022/0252681 A1    Aug. 11, 2022

Related U.S. Application Data

(63) Continuation of application No. 16/909,332, filed on Jun. 23, 2020, now Pat. No. 11,353,518, which is a
(Continued)

(30) Foreign Application Priority Data

Dec. 6, 2016 (JP) ................................. 2016-236826

(51) Int. Cl.
*G01R 33/06* (2006.01)
*G01R 33/00* (2006.01)
*G01R 33/09* (2006.01)

(52) U.S. Cl.
CPC ......... *G01R 33/0005* (2013.01); *G01R 33/06* (2013.01); *G01R 33/098* (2013.01)

(58) Field of Classification Search
CPC ...... G01R 33/09; G01R 33/07; G01R 33/093; G01R 33/096; G01R 33/098;
(Continued)

(56) References Cited

U.S. PATENT DOCUMENTS 8,378,674 B2  2/2013  Furukawa et al.
9,086,444 B2  7/2015  Nakajima et al.
(Continued)

FOREIGN PATENT DOCUMENTS

EP    3 141 920 A1    3/2017
JP    S56-004877 U    1/1981
(Continued)

OTHER PUBLICATIONS

Nov. 21, 2019 U.S. Office Action issued U.S. Appl. No. 15/686,592.
(Continued)

*Primary Examiner* — Jermele M Hollington
*Assistant Examiner* — Taqi R Nasir
(74) *Attorney, Agent, or Firm* — Oliff PLC

(57) ABSTRACT

A magnetic field detection device, containing a) a first soft magnetic body containing a1) a first plate including a first surface having a first outer edge; and a2) a first protrusion disposed directly or indirectly on the first surface of the first plate at a first arrangement position set back from the first outer edge, the first protrusion including a first tip on an opposite side to the first surface; and b) a magnetic detector provided in a vicinity of the first tip, wherein the magnetic detector has a magnetic sensing direction along the first surface, and the first protrusion is capable of bending a direction of a first magnetic flux, which comes into the first plate, along the first surface.

23 Claims, 22 Drawing Sheets

Related U.S. Application Data continuation of application No. 15/686,592, filed on Aug. 25, 2017, now Pat. No. 10,732,232.

(58) Field of Classification Search
CPC ............ G01R 19/0092; G01R 33/0011; G01R 33/0052; G01R 33/02; G01R 33/0005; G01R 33/06

See application file for complete search history.

(56) References Cited

U.S. PATENT DOCUMENTS

| | | | |
|---|---|---|---|
| 9,349,397 B2* | 5/2016 | Hattori | ................... H10N 50/01 |
| 10,732,232 B2 | 8/2020 | Nagata et al. | |
| 2008/0087630 A1* | 4/2008 | Ito | ...................... G11B 5/00826 216/22 |
| 2012/0200292 A1 | 8/2012 | Sugihara et al. | |
| 2012/0217961 A1 | 8/2012 | Ando et al. | |
| 2016/0266219 A1 | 9/2016 | Tanabe | |
| 2017/0160351 A1 | 6/2017 | Yamamoto et al. | |
| 2017/0276739 A1* | 9/2017 | Obana | ................. G01R 33/091 |

FOREIGN PATENT DOCUMENTS

| | | |
|---|---|---|
| JP | H11-261130 A | 9/1999 |
| JP | 2000-065511 A | 3/2000 |
| JP | 2008-304470 A | 12/2008 |
| JP | 2013-238485 A | 11/2013 |
| JP | 2016-017830 A | 2/2016 |
| JP | 2016-176707 A | 10/2016 |
| WO | 2009/048018 A1 | 4/2009 |
| WO | 2008/146809 A1 | 8/2010 |
| WO | 2011/081197 A1 | 7/2011 |
| WO | 2015/170509 A1 | 11/2015 |

OTHER PUBLICATIONS

Mar. 23, 2020 Notice of Allowance issued in U.S. Appl. No. 15/686,592.
Oct. 18, 2021 Office Action issued in U.S. Appl. No. 16/909,332.
Feb. 7, 2022 Notice of Allowance Issued In U.S. Appl. No. 16/909,332.
Mar. 15, 2023 Office Action issued in German Patent Application No. 102017119905.5.

* cited by examiner

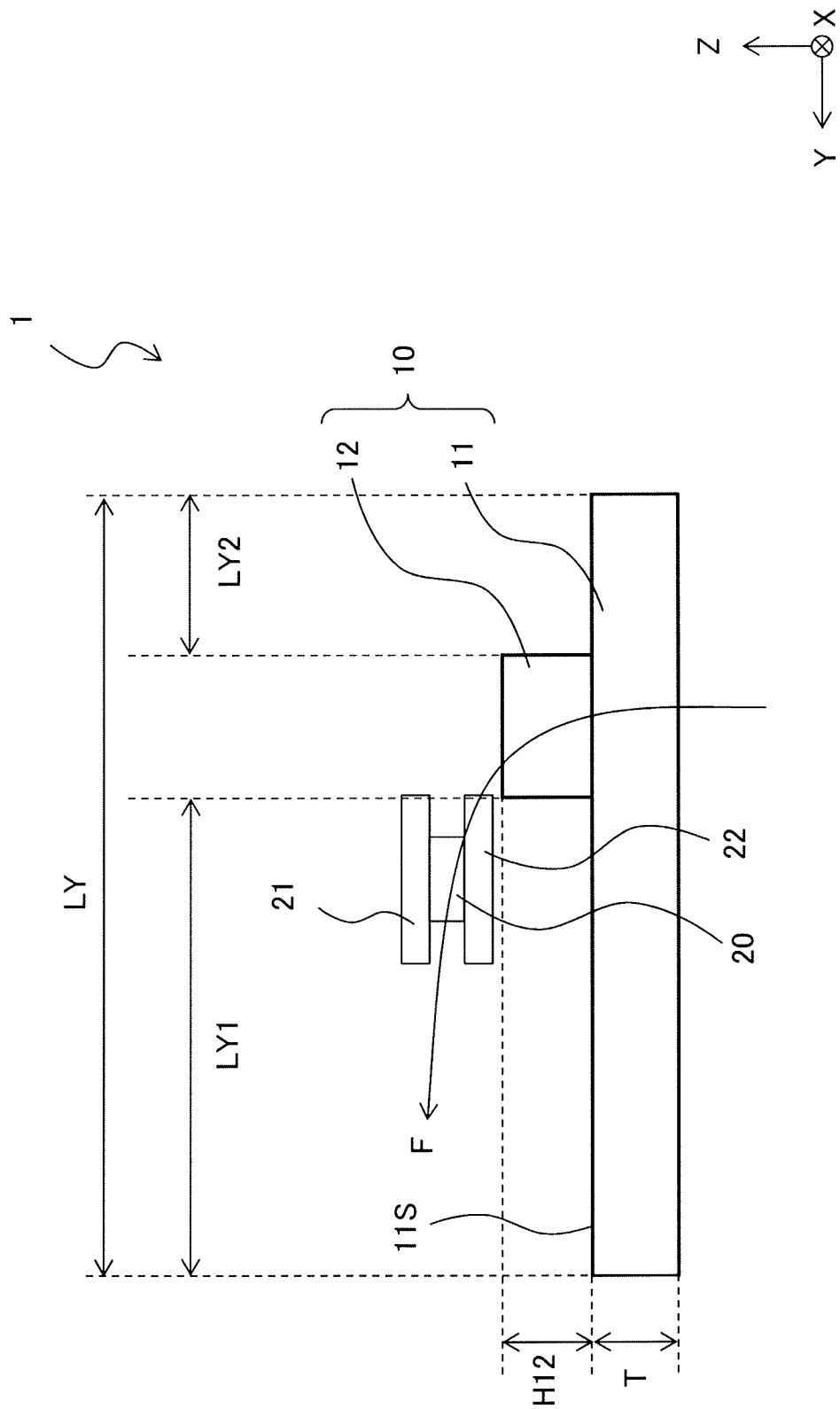

MAGNETIC FIELD DETECTION DEVICE

CROSS REFERENCE TO RELATED APPLICATIONS

This is a Continuation of application Ser. No. 16/909,332, filed Jun. 23, 2020, which is a Continuation of application Ser. No. 15/686,592 filed Aug. 25, 2017, now U.S. Pat. No. 10,732,232, which claims the benefit of Japanese Application No. 2016-236826 filed Dec. 6, 2016. The disclosures of the prior applications are hereby incorporated by reference herein in their entireties.

BACKGROUND

The invention relates to a magnetic field detection device that detects a magnetic field using a magnetic detector.

Magnetic field detection devices detect external magnetic fields. As the magnetic field detection devices, known are those that utilize Hall elements or magneto-resistive effect elements. For example, reference is made to International Publication No. WO2008/146809.

SUMMARY

In recent years, there has been a desire for enhancement in performance of magnetic field detection. It is therefore desirable to provide a magnetic field detection device that has more optimal performance of magnetic field detection.

A magnetic field detection device according to a first illustrative embodiment of the invention includes a first soft magnetic body and a magnetic detector. The first soft magnetic body includes a first plate and a first protrusion. The first plate includes a first surface including a first outer edge. The first protrusion is provided at a first arrangement position in the first surface and includes a first tip on opposite side to the first surface. The first arrangement position is set back from the first outer edge. The magnetic detector is provided in the vicinity of the first tip.

Here, the term "the vicinity of the first tip" refers to a range that is influenced by a magnetic flux that runs though the first tip.

A magnetic field detection device according to a second illustrative embodiment of the invention includes a first soft magnetic body and a plurality of magnetic detectors. The first soft magnetic body includes a first plate and a plurality of first protrusions. The first plate includes a first surface including a first outer edge. The plurality of the first protrusions are provided at respective first arrangement positions in the first surface and include respective first tips on opposite side to the first surface. The first arrangement positions are set back from the first outer edge. The plurality of the magnetic detectors are provided in the vicinity of the respective first tips of the plurality of the first protrusions.

BRIEF DESCRIPTION OF THE DRAWINGS

FIG. 1B is a cross-sectional view of a cross-sectional configuration of the magnetic field detection device illustrated in FIG. 1A.

DETAILED DESCRIPTION

Some example embodiments of the invention are described in detail below with reference to the accompanying drawings. The description is given in the following order.

1. First Embodiment and its Modification Examples

An example of a magnetic field detection device including a single soft magnetic body and a single magnetic detector, in which the single soft magnetic body includes a plate and a protrusion 2. Second Embodiment and its Modification Examples An example of a magnetic field detection device including a pair of soft magnetic bodies and a single magnetic detector, in which the pair of the magnetic bodies each include a plate and a protrusion 3. Third Embodiment An example of a magnetic field detection device including a pair of soft magnetic bodies and a plurality of magnetic detectors, in which the pair of the magnetic bodies each include a plate and a plurality of protrusions thereon 4. Experimental Examples 5. Other Modification Examples 1. First Embodiment

[Configuration of Magnetic Field Detection Device 1]

Figure 1A:
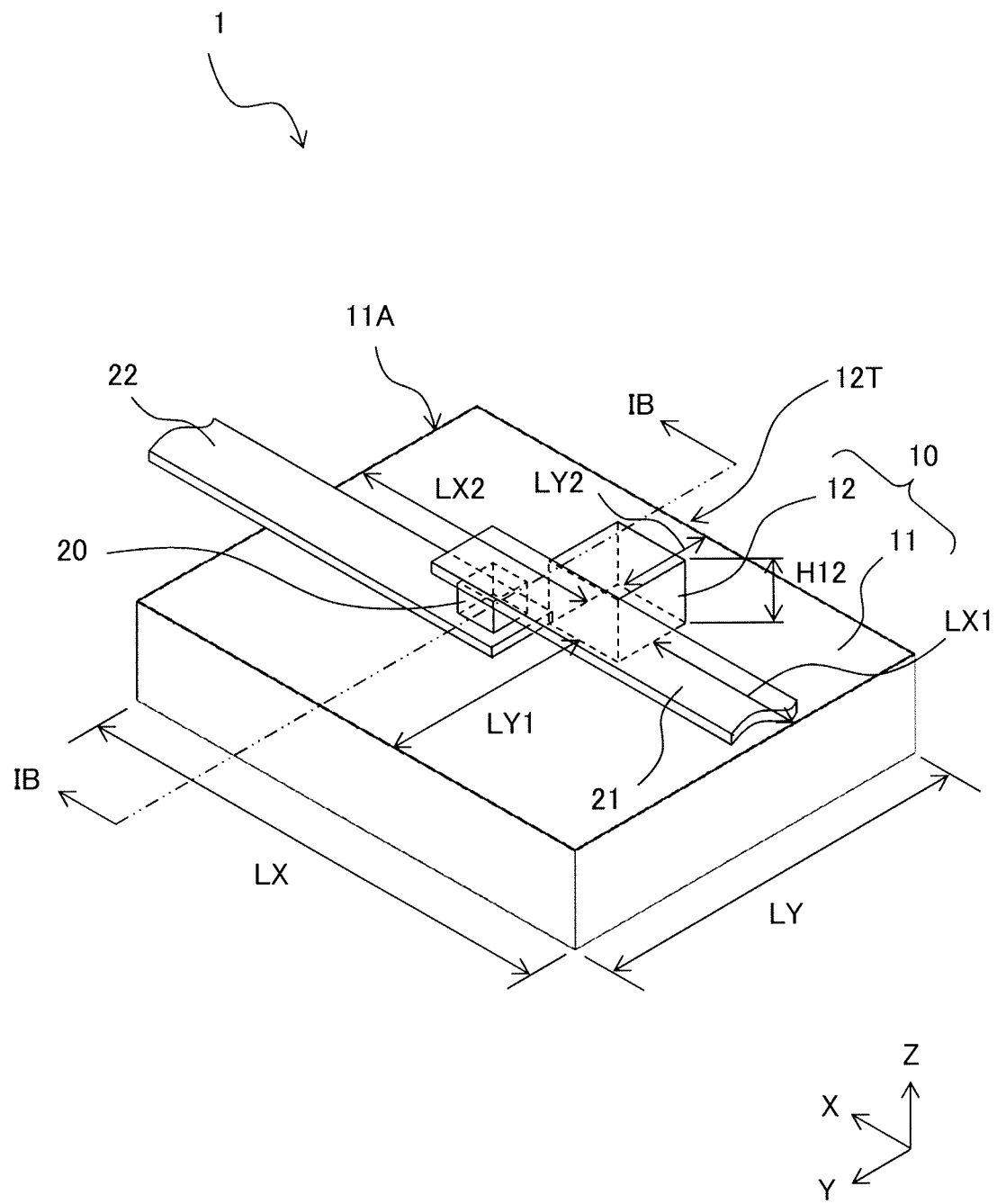
FIG. 1A is a schematic perspective view of an overall configuration of a magnetic field detection device according to a first embodiment of the invention.
Figure 2:
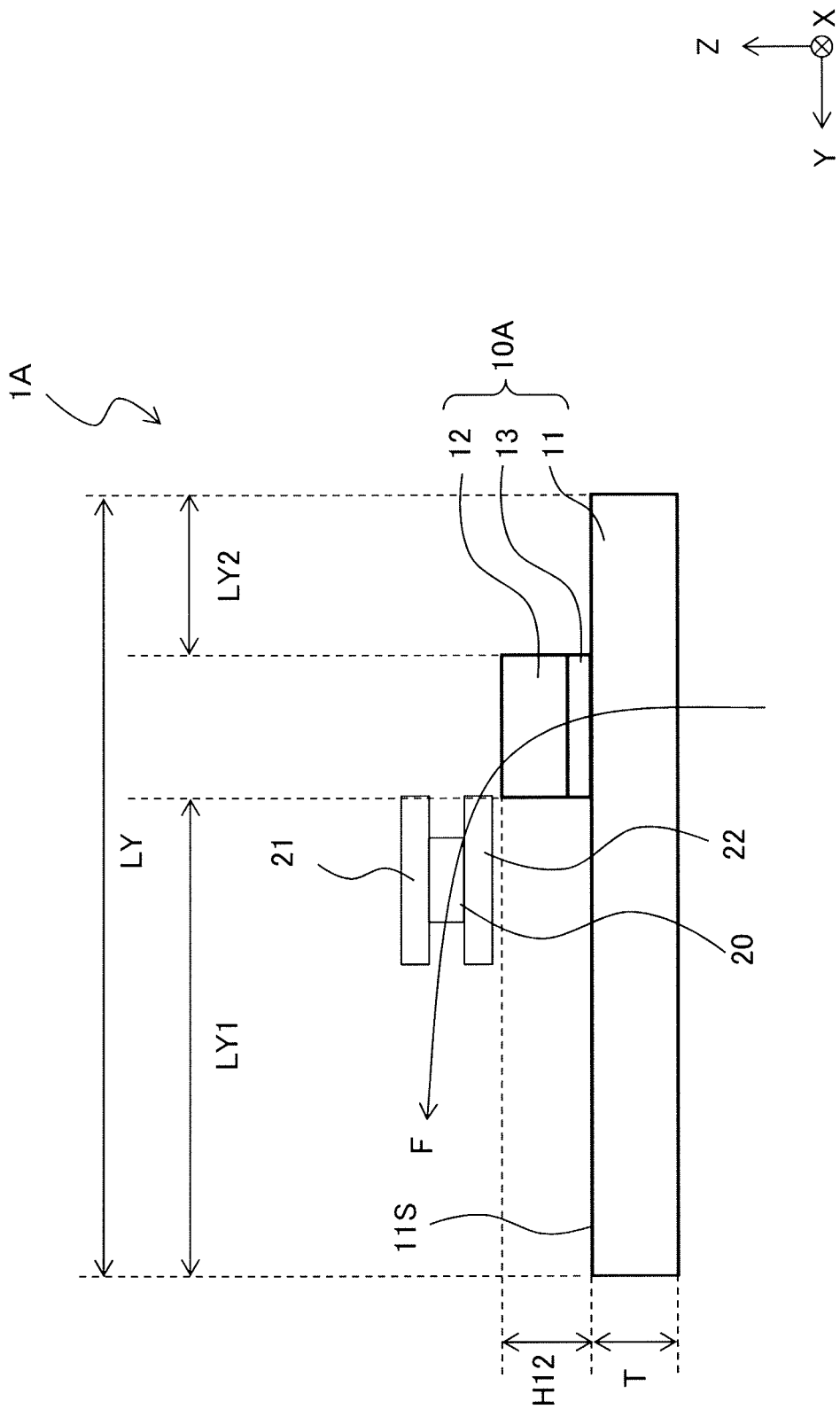
FIG. 2 is a cross-sectional view of a modification example (a first modification example) of the magnetic field detection device illustrated in FIG. 1A.
Figure 3:
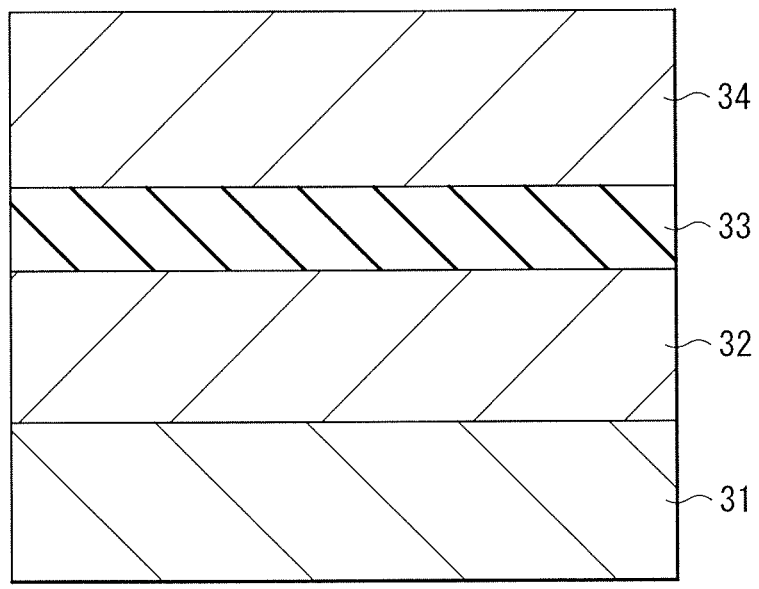
FIG. 3 is an enlarged cross-sectional view of a cross-sectional configuration of a magnetic detector illustrated in FIG. 1A.

Description is given first of a configuration of a magnetic field detection device 1 according to a first embodiment of the invention, with reference to the figures such as FIGS. 1A, 1B, and 2. FIG. 1A is a perspective view of an example of an overall configuration of the magnetic field detection device 1. FIG. 1B illustrates an example of a cross-sectional configuration of the magnetic field detection device 1 viewed in a direction of an arrow along a line IB-IB illustrated in FIG. 1A. FIG. 2 illustrates an example of a cross-sectional configuration of a soft magnetic body 10A as a modification example. FIG. 3 illustrates an example of a cross-sectional configuration of a magnetic detector 20 illustrated in FIGS. 1A and 1B.

The magnetic field detection device 1 may be a device that detects presence or absence of an external magnetic field that covers the magnetic field detection device 1 itself, and detects a direction or strength, or other properties of the external magnetic field. The magnetic field detection device 1 may be mounted on an electromagnetic compass, without limitation. The magnetic field detection device 1 includes a single soft magnetic body 10 and the single magnetic detector 20. The soft magnetic body 10 may extend in, for example, an X axis direction and a Y axis direction. The magnetic field detection device 1 may further include leads 21 and 22 that cause a sense current to flow to the magnetic detector 20.

[Soft Magnetic Body 10]

The soft magnetic body 10 includes a plate 11 and a protrusion 12. The plate 11 includes a flat surface 11S that extends along an X-Y plane. The protrusion 12 is provided on the flat surface 11S, to protrude in a Z axis direction that is orthogonal to the X-Y plane. The plate 11 and the protrusion 12 may both be made of, for example but not limited to, a soft magnetic metal material having high saturation magnetic flux density, e.g., a nickel-iron alloy (Ni—Fe). A constituent material of the plate 11 and a constituent material of the protrusion 12 may be different, but it is desirable that they be the same from the viewpoint of easy manufacture.

As illustrated in FIG. 1A, the plate 11 may be a substantially rectangular parallelepiped member that includes a rectangular outer edge 11A in the X-Y plane. The protrusion 12 is provided at a position set back from the outer edge 11A, in the flat surface 11S. The protrusion 12 includes a tip 12T on opposite side to the flat surface 11S. Here, in one preferable but non-limiting example, the following conditional expression [1A] and the following conditional expression [1B] may be satisfied, $$LX1/H12 \geq 1, LX2/H12 \geq 1 \qquad [1A]$$

$$LY1/H12 \geq 1, LY2/H12 \geq 1 \qquad [1B]$$

In the expressions, LX denotes a dimension of the plate 11 in the X axis direction. LY denotes a dimension of the plate 11 in the Y axis direction. LX1 or LX2 denotes a length in the X axis direction along the X-Y plane, from the outer edge 11A to an outer edge of the protrusion 12. LY1 or LY2 denotes a length in the Y axis direction along the X-Y plane, from the outer edge 11A to the outer edge of the protrusion 12. H12 denotes a height of the tip 12T with respect to the flat surface 11S, in a heightwise direction orthogonal to the flat surface 11S, i.e., the Z axis direction.

It is to be noted that this embodiment gives an example in which the plate 11 and the protrusion 12 may be in direct contact, but this is non-limiting. FIG. 2 illustrates a magnetic field detection device 1A according to a first modification example. As illustrated in FIG. 2, the magnetic field detection device 1A may include the soft magnetic body 10A. The soft magnetic body 10A may further include a non-magnetic layer 13 between the plate 11 and the protrusion 12.

[Magnetic Detector 20]

The magnetic detector 20 is provided in the vicinity of the tip 12T. In other words, the magnetic detector 20 may be provided in a range covered by influences of a magnetic flux F that runs through the tip 12T. The magnetic detector 20 may be, for example but not limited to, a magneto-resistive effect (MR) element that exhibits a change in resistance in accordance with the direction or the strength of the external magnetic field. As illustrated in, for example, FIG. 3, the magnetic detector 20 may be a current perpendicular to plane (CPP) MR element of a spin valve structure including a stack of a plurality of functional films including a magnetic layer, and allow the sense current to flow through an inside of itself in a stacking direction. In one specific but non-limiting example, as illustrated in FIG. 3, the magnetic detector 20 may include a stacked body in which an antiferromagnetic layer 31, a magnetization fixed layer 32, an intermediate layer 33, and a magnetization free layer 34 are stacked in order. The magnetization fixed layer 32 may have magnetization fixed in a constant direction. The intermediate layer 33 may exhibit no specific direction of magnetization. The magnetization free layer 34 may have magnetization that changes with the external magnetic field. It is to be noted that the antiferromagnetic layer 31, the magnetization fixed layer 32, the intermediate layer 33, and the magnetization free layer 34 may each have either a single-layer structure or a multi-layered structure including a plurality of layers. In the MR element as described above, the change in the resistance occurs in accordance with a change in a magnetic flux along an in-plane direction of the films that is orthogonal to the stacking direction. In the magnetic field detection device 1, the stacking direction of the magnetic detector 20 may be, for example, the Z axis direction. This causes the change in the resistance to occur in accordance with a change in the magnetic flux F (FIG. 1B) bent in the Y axis direction.

The antiferromagnetic layer 31 may be made of an antiferromagnetic material such as a platinum-manganese alloy (Pt—Mn) and an iridium-manganese alloy (Ir—Mn). The antiferromagnetic layer 31 may be in a state in which, for example, a spin magnetic moment in the substantially same direction as the direction of the magnetization of the magnetization fixed layer 32 in adjacency thereto and a spin magnetic moment in an opposite direction thereto cancel each other completely. Thus, the antiferromagnetic layer 31 may act to fix the direction of the magnetization of the magnetization fixed layer 32 in the constant direction.

The magnetization fixed layer 32 may be made of a ferromagnetic material such as cobalt (Co), a cobalt-iron alloy (Co—Fe), a cobalt-iron-boron alloy (Co—Fe—B).

The intermediate layer 33 may be a non-magnetic tunnel barrier layer made of, for example but not limited to, magnesium oxide (MgO), in a case where the magnetic detector 20 is a magnetic tunneling junction (MTJ) element. The intermediate layer 33 may be thin enough to allow a tunneling current based on quantum mechanics to pass through. The MgO tunneling barrier layer may be produced by, for example, a sputtering process using an MgO target. In addition, the MgO tunneling barrier layer may be produced by an oxidization process of a magnesium (Mg) thin film, or a reactive sputtering process that involves magnesium sputtering in an oxygen atmosphere. Moreover, in addition to MgO, the intermediate layer 33 may be constituted with the utilization of an oxide or a nitride of aluminum (Al), tantalum (Ta), and/or hafnium (Hf). Furthermore, the intermediate layer 33 may be made of a non-magnetic highly conductive material such as copper (Cu), ruthenium (Ru), and gold (Au), in a case where the magnetic detector 20 is, for example, a giant magnetoresistive (GMR) element.

The magnetization free layer 34 may be a soft ferromagnetic layer, and have an axis of easy magnetization that is substantially orthogonal to, for example, the direction of the magnetization of the magnetization fixed layer 32. The magnetization free layer 34 may be made of, for example but not limited to, the cobalt-iron alloy (Co—Fe), the nickel-iron alloy (Ni—Fe), or the cobalt-iron-boron alloy (Co—Fe—B).

[Leads 21 and 22]

The lead 21 may extend in the X-Y plane, to be in contact with one end surface of the magnetic detector 20, e.g., the magnetization free layer 34. The lead 22 may extend in the X-Y plane, to be in contact with another end surface of the magnetic detector 20, e.g., the antiferromagnetic layer 31. The leads 21 and 22 may be made of, for example but not limited to, a highly conductive non-magnetic material such as copper and aluminum (Al).

[Signal Detection Circuit]

Figure 4:
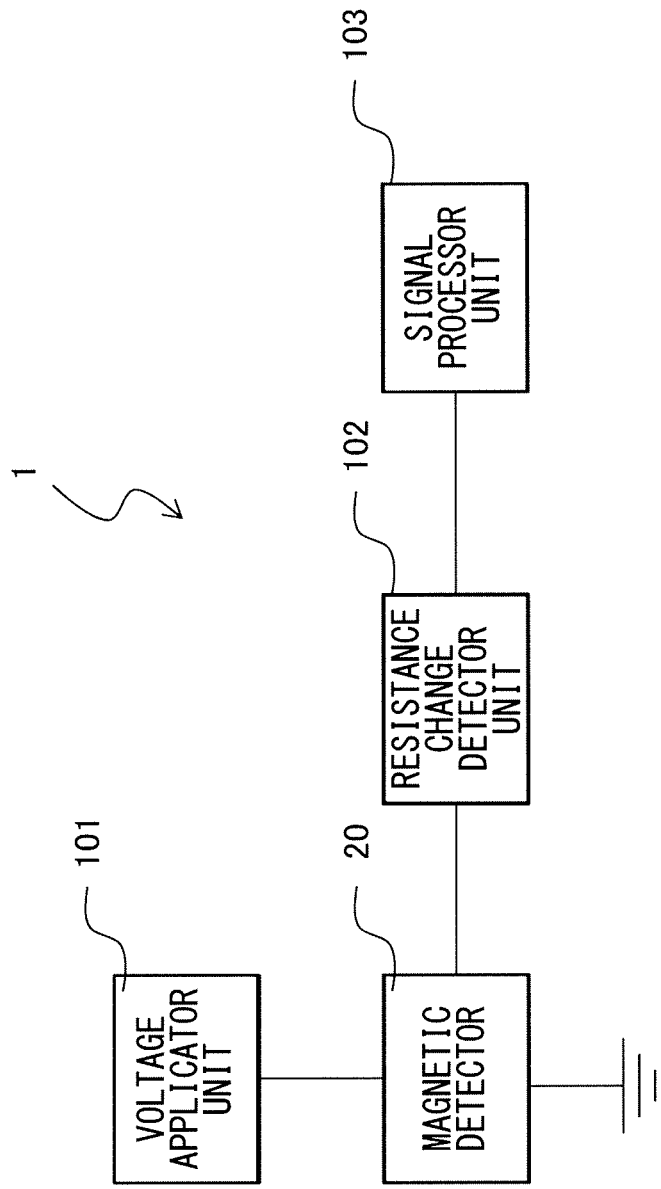
FIG. 4 is a circuit diagram of an example of a signal detection circuit mounted on the magnetic field detection device illustrated in FIG. 1A.

The magnetic field detection device 1 may include a signal detection circuit as illustrated in, for example, FIG. 4. The signal detection circuit may include, for example but not limited to, a voltage applicator unit 101, the magnetic detector 20, a resistance change detector unit 102, and a signal processor unit 103. The voltage applicator unit 101 and the resistance change detector unit 102 may be coupled to the magnetic detector 20. The signal processor unit 103 may be coupled to the resistance change detector unit 102.

[Workings and Effects of Magnetic Field Detection Device 1]

In the magnetic field detection device 1, by the signal detection circuit as described above, obtained is an output in accordance with the external magnetic field that covers the magnetic field detection device 1. In one specific but non-limiting example, in the signal detection circuit as mentioned above, a predetermined voltage is applied by the voltage applicator unit 101 to between the lead 21 and the lead 22, causing the flow of the sense current that corresponds to electrical resistance of the magnetic detector 20 at that time. The electrical resistance of the magnetic detector 20 changes with a state of magnetization of the magnetic detector 20, i.e., the direction of the magnetization of the magnetization free layer 34 with respect to the direction of the magnetization of the magnetization fixed layer 32. The sense current that flows through the magnetic detector 20 is detected in the resistance change detector unit 102, causing a signal to be outputted by the resistance change detector unit 102 to the signal processor unit 103. Furthermore, in the signal processor unit 103, generated is a signal based on the output from the resistance change detector unit 102. The signal thus generated is outputted to outside. Thus, an output in accordance with the external magnetic field that covers the magnetic field detection device 1 is obtained from the signal detection circuit.

In the magnetic field detection device 1 according to this embodiment, the soft magnetic body 10 includes the plate 11 and the protrusion 12. The plate 11 includes the flat surface 11S. The magnetic detector 20 is provided in the vicinity of the tip 12T of the protrusion 12. Accordingly, the magnetic flux F that comes into the plate 11 effectively converges on the protrusion 12. This leads to higher densification of the magnetic flux F that runs from the protrusion 12 to the magnetic detector 20 through the tip 12T of the protrusion 12.

In other words, according to the magnetic field detection device 1, the soft magnetic body 10 serves as a magnetic yoke with respect to an external magnetic field component in the Z axis direction, and enhances the external magnetic field component. Hence, it is possible to exhibit high performance in magnetic field detection, with respect to the external magnetic field component in the Z axis direction.

2. Second Embodiment

Figure 5A:
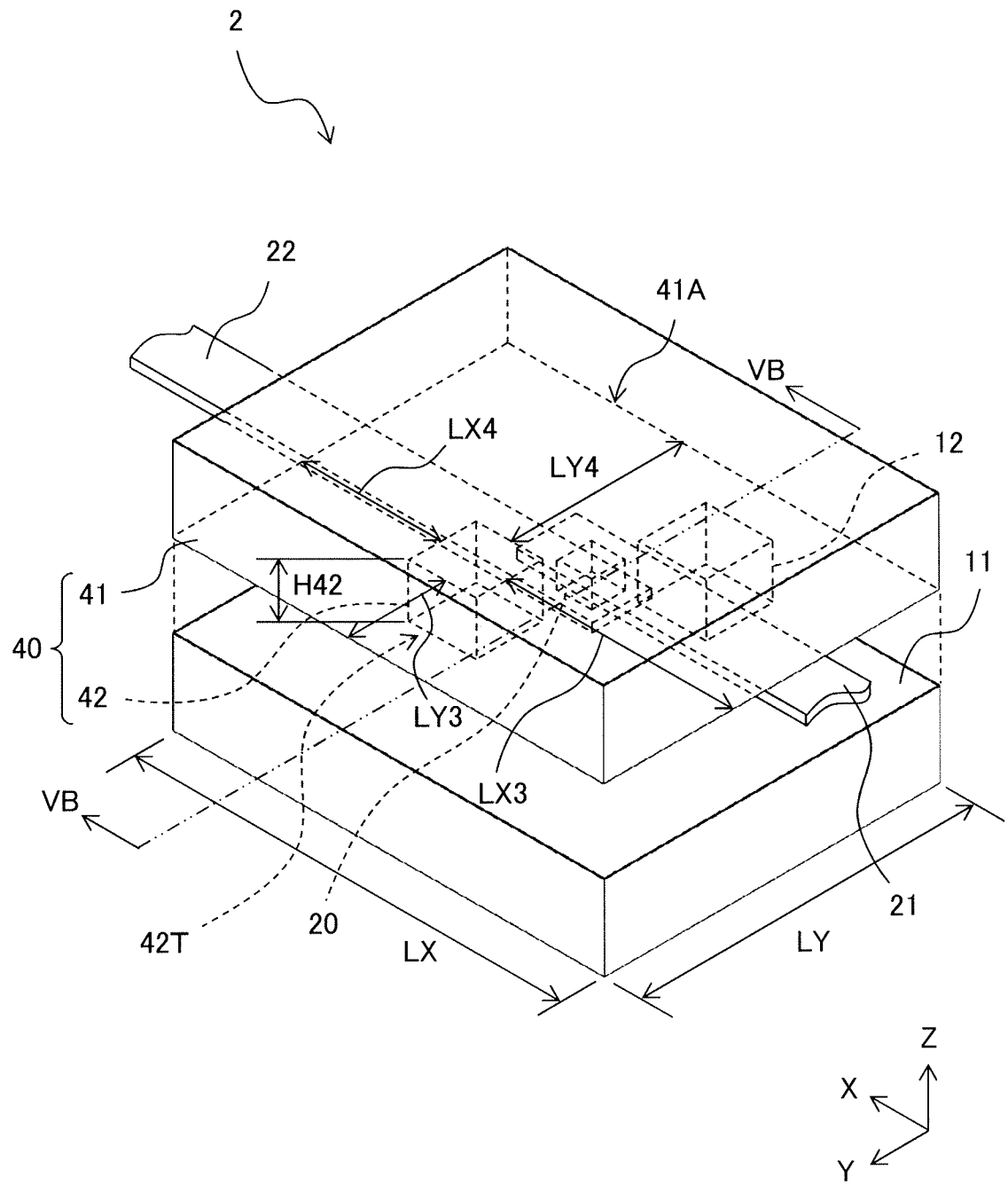
FIG. 5A is a schematic perspective view of an overall configuration of a magnetic field detection device according to a second embodiment of the invention.
Figure 5B:
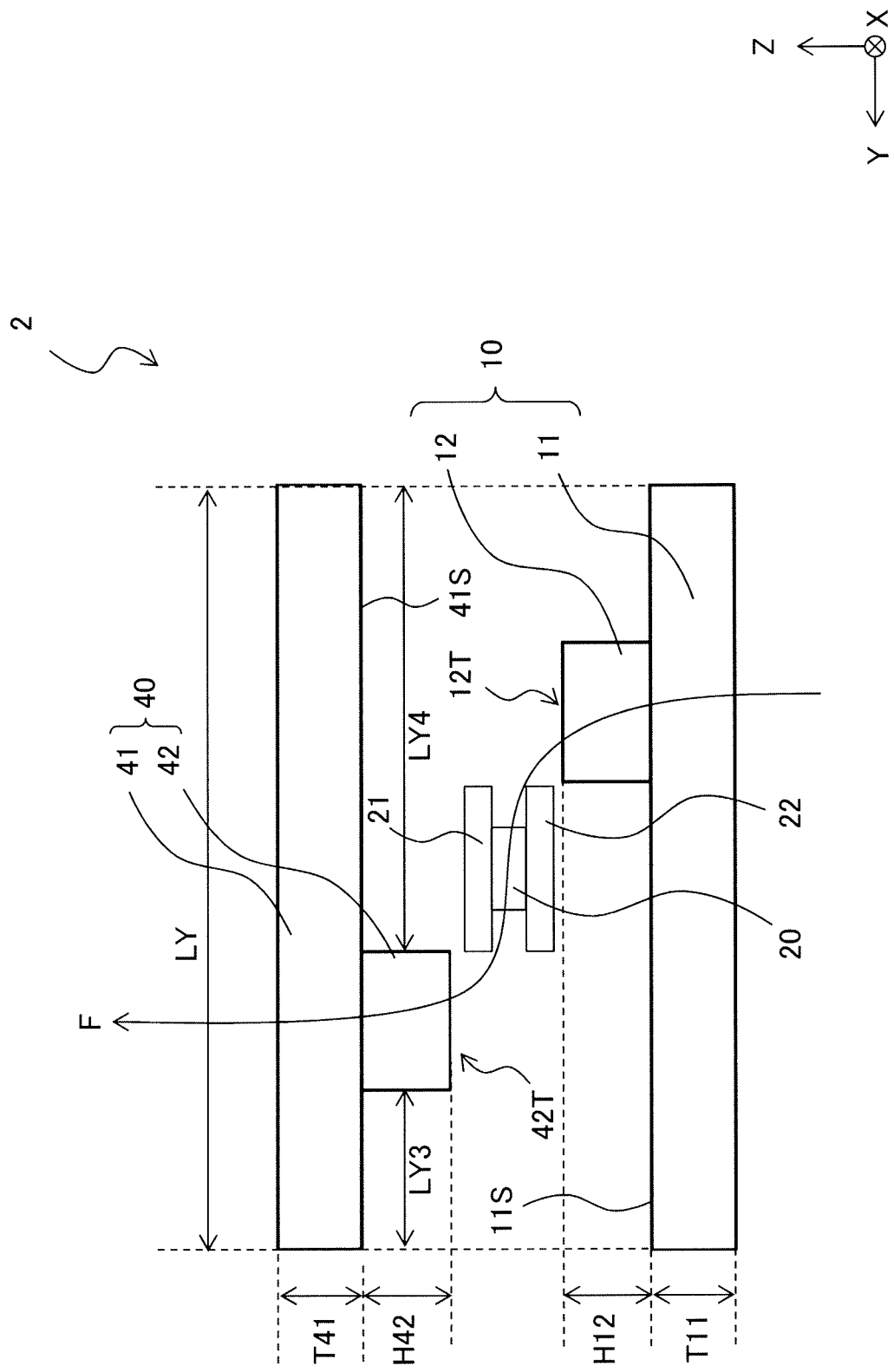
FIG. 5B is a cross-sectional view of a cross-sectional configuration of the magnetic field detection device illustrated in FIG. 5A.

Description is given next of a configuration of a magnetic field detection device 2 according to a second embodiment of the invention, with reference to FIGS. 5A and 5B. FIG. 5A is a perspective view of an example of an overall configuration of the magnetic field detection device 2. FIG. 5B illustrates an example of a cross-sectional configuration of the magnetic field detection device 2 viewed in a direction of an arrow along a line VB-VB illustrated in FIG. 5A.

The magnetic field detection device 2 according to this embodiment may further include a soft magnetic body 40, in addition to the soft magnetic body 10 and the magnetic detector 20. The soft magnetic body 40 may be disposed in confronted relation with the soft magnetic body 10, with the magnetic detector 20 interposed therebetween. The soft magnetic body 40 may include a plate 41 and a protrusion 42, as with the soft magnetic body 10. The plate 41 may include a flat surface 41S that extends in the X-Y plane. The flat surface 41S may be confronted with the flat surface 11S. The protrusion 42 may be provided on the flat surface 41S, to protrude in the Z axis direction toward the flat surface 11S. The plate 41 and the protrusion 42 may both be made of, for example but not limited to, the soft magnetic metal material having the high saturation magnetic flux density, e.g., Ni—Fe. A constituent material of the plate 41 and a constituent material of the protrusion 42 may be different, but it is desirable that they be the same from the viewpoint of the easy manufacture.

As illustrated in FIG. 5A, the plate 41 may be a substantially rectangular parallelepiped member that includes a rectangular outer edge 41A in the X-Y plane. The protrusion 42 may be provided at a position set back from the outer edge 41A, in the flat surface 41S. The protrusion 42 may include a tip 42T on opposite side to the flat surface 41S. Here, in one preferable but non-limiting example, the following conditional expression [2A] and the following conditional expression [2B] may be satisfied, $$LX3/H42 \geq 1, LX4/H42 \geq 1 \quad [2A]$$

$$LY3/H42 \geq 1, LY4/H42 \geq 1 \quad [2B]$$

In the expressions, LX denotes a dimension of the plate 41 in the X axis direction. LY denotes a dimension of the plate 41 in the Y axis direction. LX3 or LX4 denotes a length in the X axis direction along the X-Y plane, from the outer edge 41A to an outer edge of the protrusion 42. LY3 or LY4 denotes a length in the Y axis direction along the X-Y plane, from the outer edge 41A to the outer edge of the protrusion 42. H42 denotes a height of the tip 42T with respect to the flat surface 41S, in a heightwise direction orthogonal to the flat surface 41S, i.e., the Z axis direction.

The magnetic detector 20 may be provided between the tip 12T of the protrusion 12 and the tip 42T of the protrusion 42, in, for example, the Y axis direction. Moreover, in the Z axis direction as well, the magnetic detector 20 may be provided at a level between the tip 12T of the protrusion 12 and the tip 42T of the protrusion 42.

Figure 6:
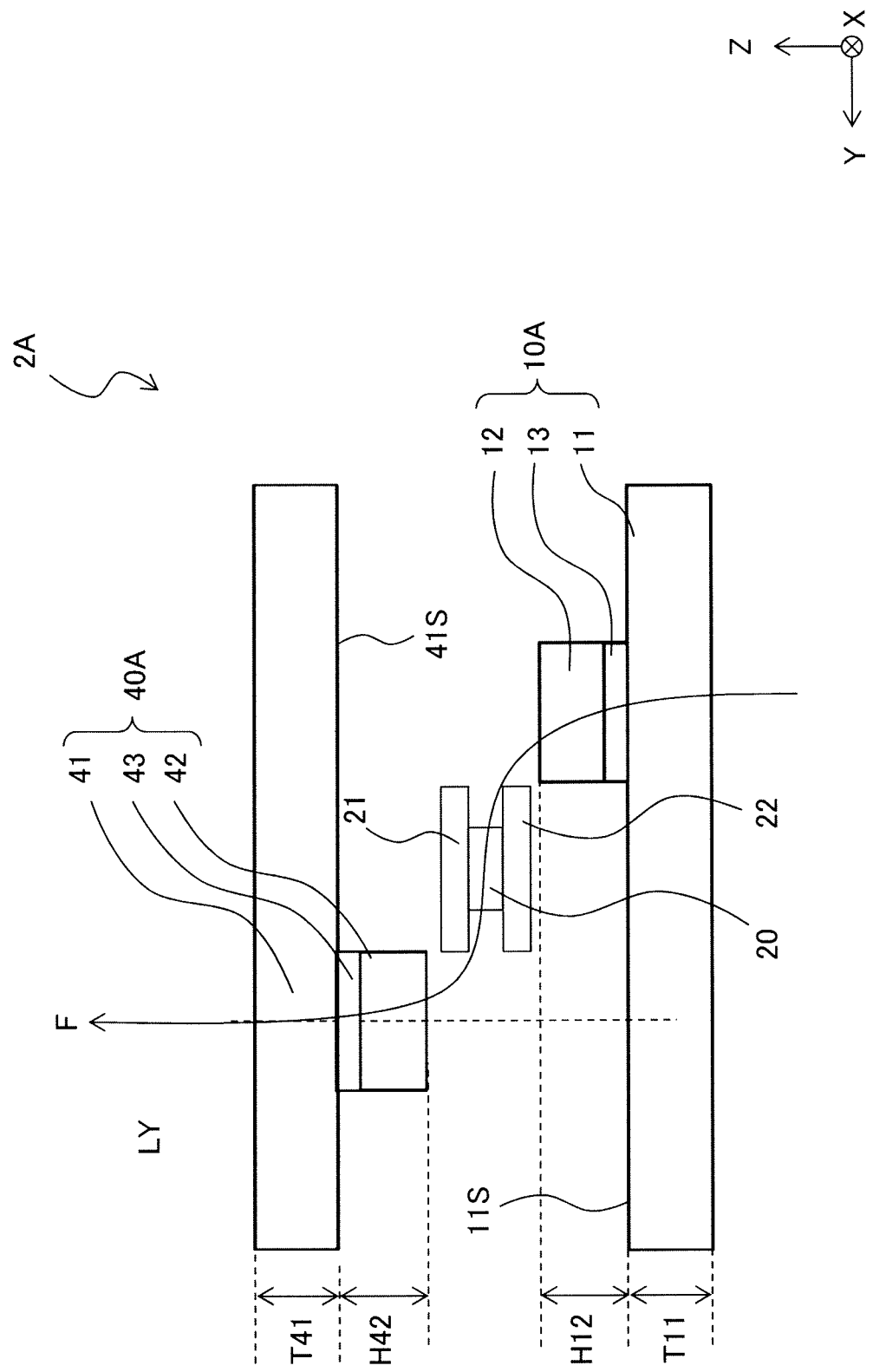
FIG. 6 is a cross-sectional view of a modification example (a second modification example) of the magnetic field detection device illustrated in FIG. 5A.

It is to be noted that this embodiment gives an example in which the plate 11 and the protrusion 12 may be in direct contact, but this is non-limiting. FIG. 6 illustrates a magnetic field detection device 2A according to a second modification example. As illustrated in FIG. 6, the magnetic field detection device 2A may include the soft magnetic body 10A. The soft magnetic body 10A may further include the non-magnetic layer 13 between the plate 11 and the protrusion 12. Likewise, this embodiment gives an example in which the plate 41 and the protrusion 42 may be in direct contact, but this is non-limiting. As illustrated in FIG. 6, the magnetic field detection device 2A according to the second modification example may include a soft magnetic body 40A. The soft magnetic body 40A may further include a non-magnetic layer 43 between the plate 41 and the protrusion 42.

As described, in the magnetic field detection device 2, the soft magnetic body 10 and the soft magnetic body 40 may be disposed in confronted relation. The soft magnetic body 10 may include the protrusion 12, whereas the soft magnetic body 40 may include the protrusion 42. The magnetic detector 20 may be provided between the protrusions 12 and 42. Accordingly, it is possible to allow the magnetic flux F caused by the external magnetic field component in the Z axis direction to converge on the magnetic detector 20. At this occasion, it is possible to bend, in the vicinity of the magnetic detector 20, a direction of the magnetic flux F along an in-plane direction of the X-Y plane. The in-plane direction of the X-Y plane serves as a direction of magnetic sensing of the magnetic detector 20. Hence, it is possible to allow a direction of extension of the plates 11 and 41 of the soft magnetic bodies 10 and 40 and a direction of extension of each layer of the magnetic detector 20 to substantially coincide with each other. This leads to easier manufacture.

3. Third Embodiment

Figure 7A:
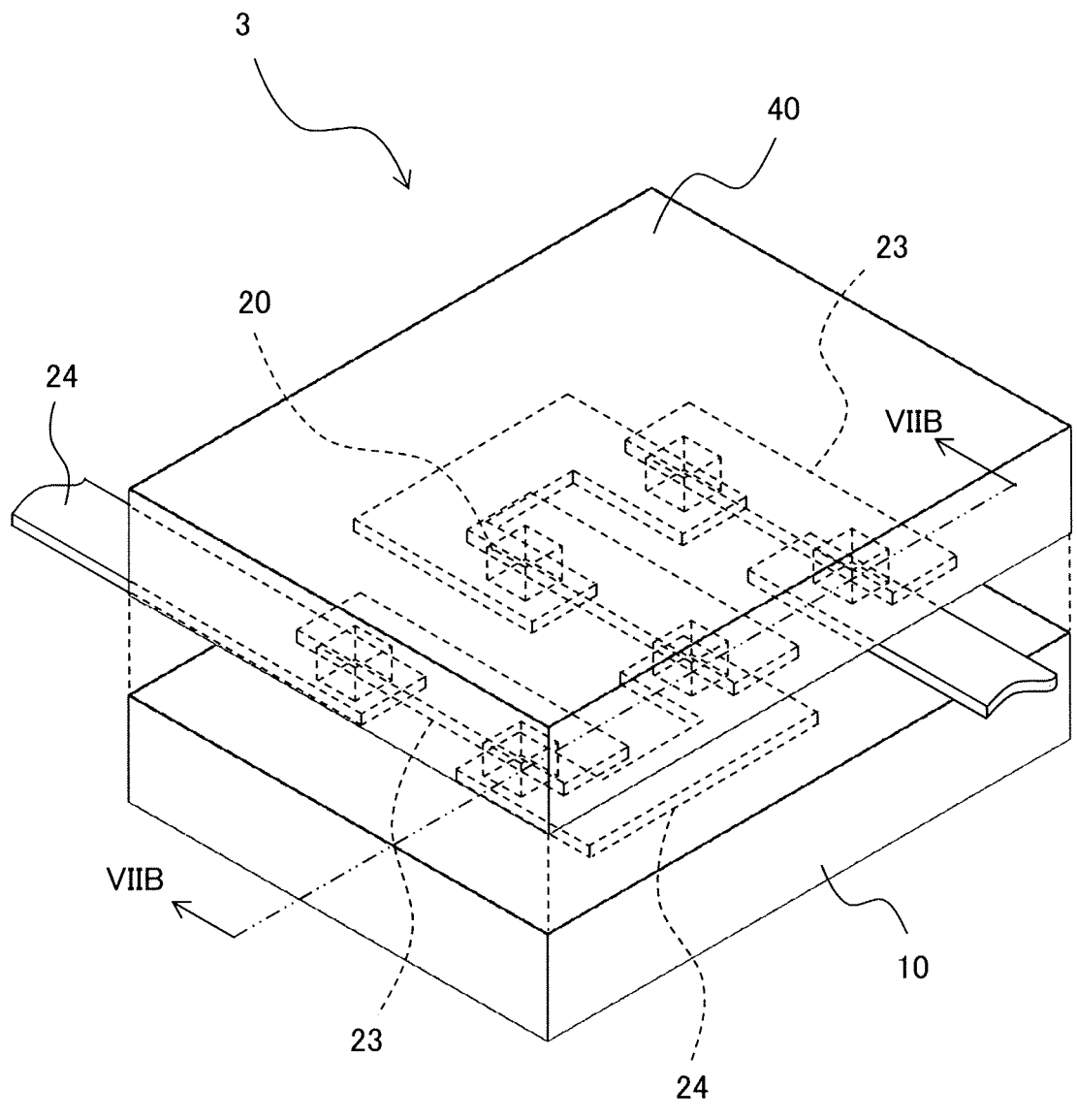
FIG. 7A is a schematic perspective view of an overall configuration of a magnetic field detection device according to a third embodiment of the invention.
Figure 7B:
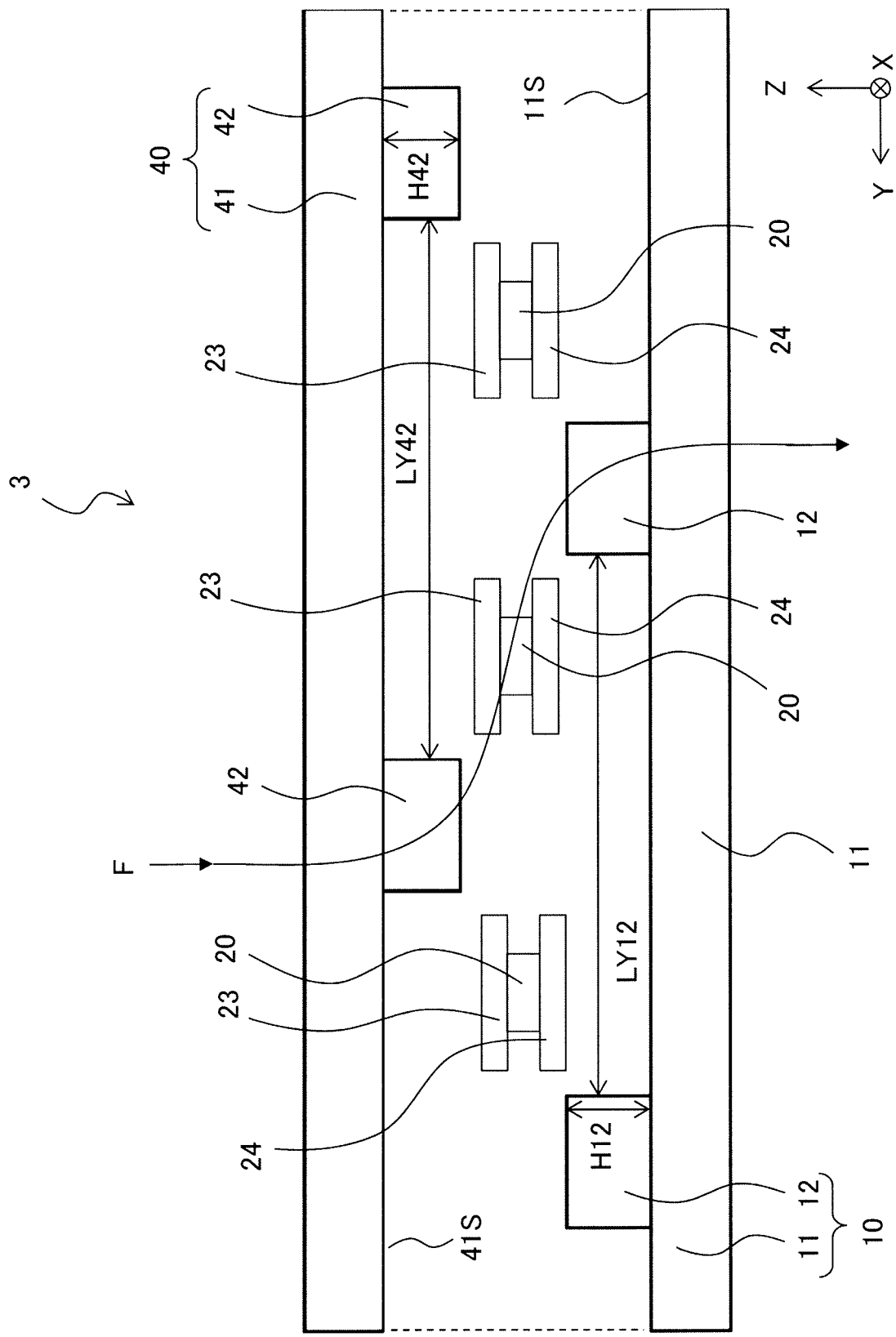
FIG. 7B is a cross-sectional view of a cross-sectional configuration of the magnetic field detection device illustrated in FIG. 7A.
Figure 7C:
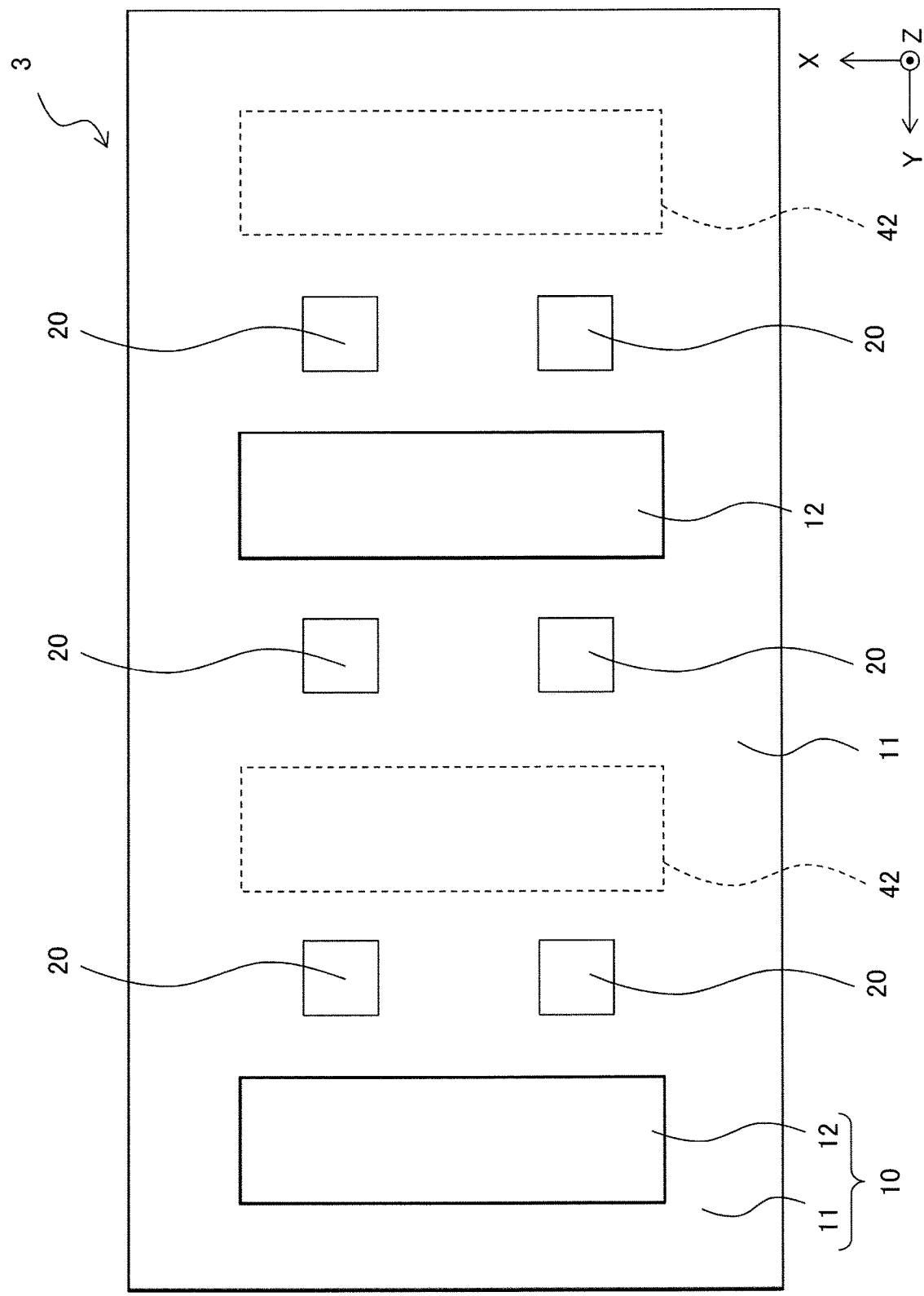
FIG. 7C is a plan view of a main part of the magnetic field detection device illustrated in FIG. 7A.

Description is given next of a configuration of a magnetic field detection device 3 according to a third embodiment of the invention, with reference to FIGS. 7A to 7C. FIG. 7A is a perspective view of an example of an overall configuration of the magnetic field detection device 3. FIG. 7B is an example of a cross-sectional configuration of the magnetic field detection device 3 viewed in a direction of an arrow along a line VIIB-VIIB illustrated in FIG. 7A. Furthermore, FIG. 7C is a plan view of a main part of the magnetic field detection device 3.

The magnetic field detection device 3 may include a plurality of the magnetic detectors 20 interposed between the pair of the soft magnetic bodies 10 and 40. FIGS. 7A and 7C illustrate, as an example, the six magnetic detectors 20 arranged in two rows and three columns, but there is no limitation on the number of the plurality of the magnetic detectors 20 and their arrangements. However, in one preferable but non-limiting example, the plurality of the magnetic detectors 20 may be provided at the same level. The plurality of the magnetic detectors 20 may be serially coupled as a whole by, for example, a plurality of leads 23 and a plurality of leads 24. The leads 23 and 24 may be made of, for example but not limited to, the highly conductive non-magnetic material such as copper and aluminum (Al). Moreover, the protrusion 12 or the protrusion 42 may be provided between any two adjacent ones of the magnetic detectors 20 (FIGS. 7B and 7C). That way, in the magnetic field detection device 3, it is possible to increase an output as a whole, as compared to the magnetic field detection device 2 in the forgoing second embodiment. It is to be noted that FIG. 7A omits illustration of the protrusion 12 and the protrusion 42, and FIG. 7C omits illustration of the leads 23 and the leads 24, for purposes of avoiding complications.

In the magnetic field detection device 3, an interval LY12 (refer to FIG. 7B) may be two or more times as large as the height H12 of the protrusion 12. The interval LY12 is an interval between the outer edges of the protrusions 12 of the soft magnetic body 10 that are in adjacency in the Y axis direction. In other words, the magnetic field detection device 3 may satisfy the following conditional expression [3], $$LY12/H12 \geq 2 \quad [3]$$

Likewise, an interval LY42 (refer to FIG. 7B) may be two or more times as large as the height H42 of the protrusion 42. The interval LY42 may be an interval between the outer edges of the protrusions 42 of the soft magnetic body 40 that are in adjacency in the Y axis direction. In other words, the magnetic field detection device 3 may satisfy the following conditional expression [4], $$LY42/H42 \geq 2 \quad [4]$$

The magnetic field detection device 3 may be manufactured, for example, by the following procedure. First, after preparing the plate 11, a first resist pattern may be formed on the flat surface 11S of the plate 11. The first resist pattern may have a plurality of apertures at positions where the protrusions 12 are to be formed. Thereafter, plating treatment may be carried out, with the plate 11 serving as a plating base, to form the plurality of the protrusions 12 made of a plating film, in the plurality of the apertures as mentioned above. Thus, the soft magnetic body 10 may be obtained. Thereafter, after removing the first resist pattern, a first insulating film may be so formed as to fill space between the protrusions 12 and to cover upper surfaces of the protrusions 12. Thereafter, the leads 24, the magnetic detectors 20, and the leads 23 in predetermined shapes may be stacked in order, at an upper level above the protrusions 12. Further, after covering an entirety with a second insulating film, a second resist pattern may be formed. The second resist pattern may have a plurality of apertures at positions where the protrusions 42 are to be formed. Thereafter, the plurality of the protrusions 42 made of a plating film may be formed in the plurality of the apertures as mentioned above. The second resist pattern may be removed. Lastly, a third insulating film may be so formed as to fill space between the plurality of the protrusions 42. The plate 41 may be so formed as to cover an entirety. That way, the soft magnetic body 40 may be obtained. Thus, the magnetic field detection device 3 may be completed.

4. Experimental Examples 4.1 Experimental Examples 1-1 and 1-2

Experimental Example 1-1

Figure 8A:
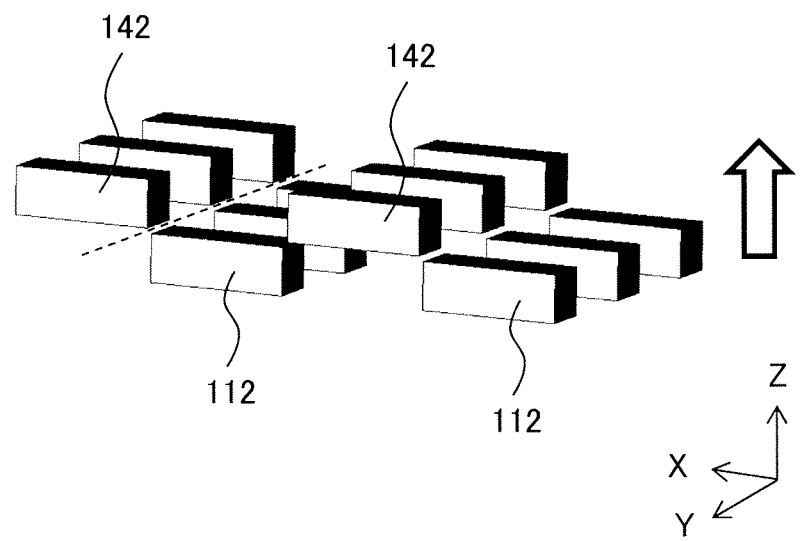
FIG. 8A schematically illustrates an arrangement state of soft magnetic bodies of an experimental example 1-1.
Figure 9A:
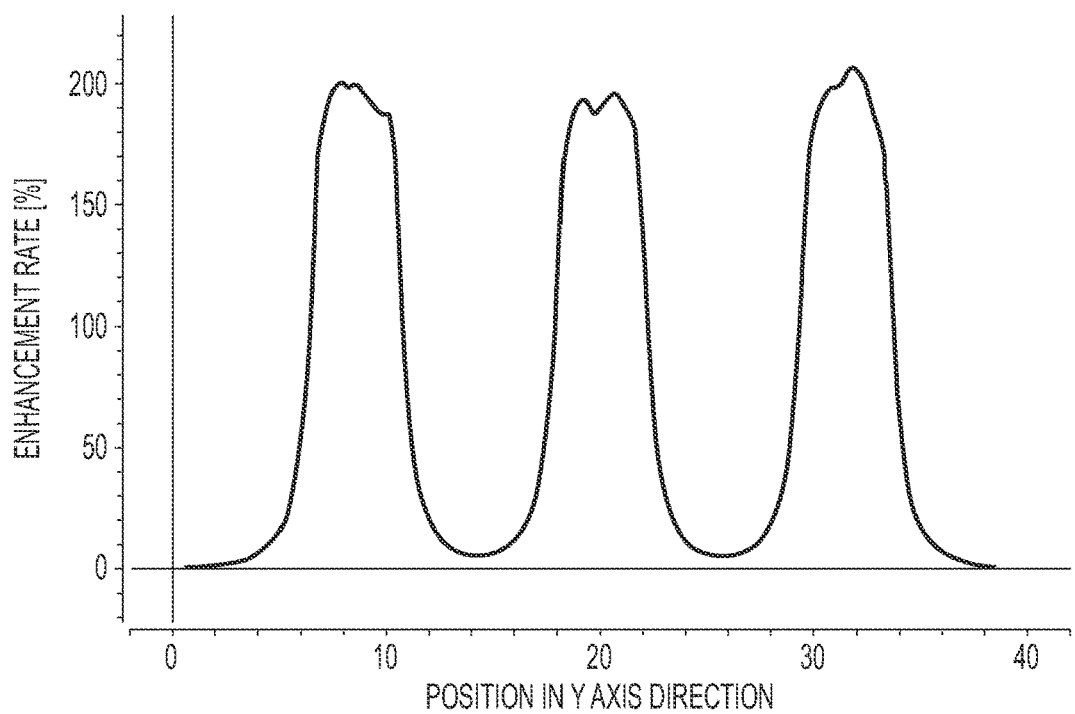
FIG. 9A is a characteristic diagram that illustrates an enhancement rate of magnetic field strength in the arrangement state of the soft magnetic bodies of the experimental example 1-1.

As illustrated in FIG. 8A, with an external magnetic field of 0.1 mT in a +Z direction being applied to a plurality of soft magnetic bodies 112 and a plurality of soft magnetic bodies 142, magnetic field strength along a broken line illustrated in FIG. 8A was obtained, to calculate an enhancement rate. A simulation result is illustrated in FIG. 9A. In FIG. 9A, a horizontal axis denotes a position [μm] in the Y axis direction, whereas a vertical axis denotes the enhancement rate [%], i.e., a ratio of the magnetic field strength along the broken line illustrated in FIG. 8A to the magnetic field strength applied. The soft magnetic bodies 112 and 142 were each rectangular parallelepiped, with a dimension in the X axis direction being 10 μm, a dimension in the Y axis direction being 4 μm, and a dimension in the Z axis direction being 3.8 μm. In the X axis direction, the soft magnetic bodies 112 and the soft magnetic bodies 142 were alternately disposed at intervals of 0.4 μm. In the Y axis direction, the three soft magnetic bodies 112 and the three soft magnetic bodies 142 were disposed. Furthermore, in the Z axis direction, the plurality of the soft magnetic bodies 112 were disposed at the same heightwise level in the Z axis direction. The plurality of the soft magnetic bodies 142 were also disposed at the same heightwise level in the Z axis direction. The heightwise level of the plurality of the soft magnetic bodies 112 and the heightwise level of the plurality of the soft magnetic bodies 142 were different, with a gap between them in the Z axis direction being 0.4 μm.

Experimental Example 1-2

Figure 8B:
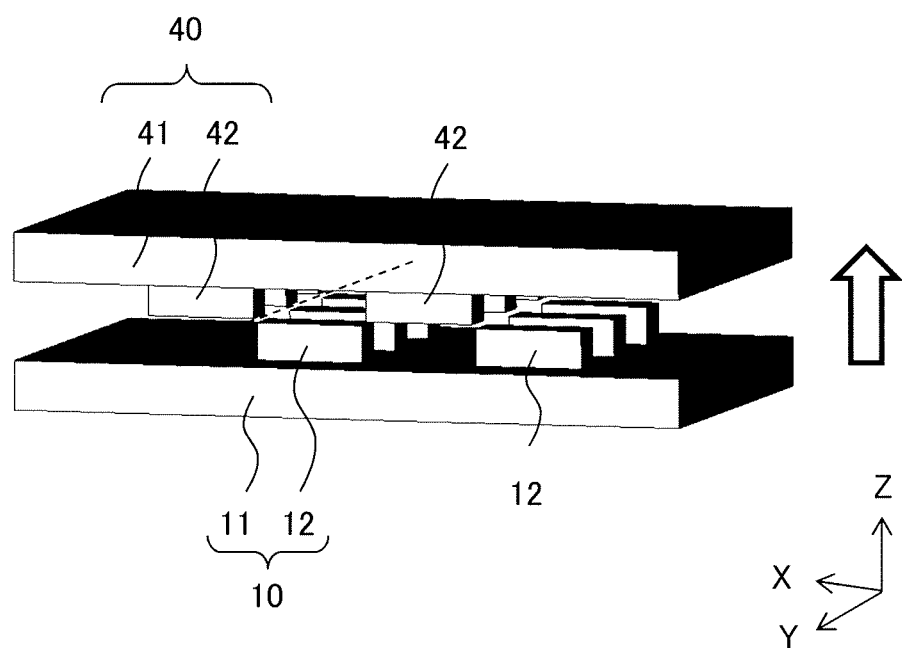
FIG. 8B schematically illustrates an arrangement state of soft magnetic bodies of an experimental example 1-2.
Figure 9B:
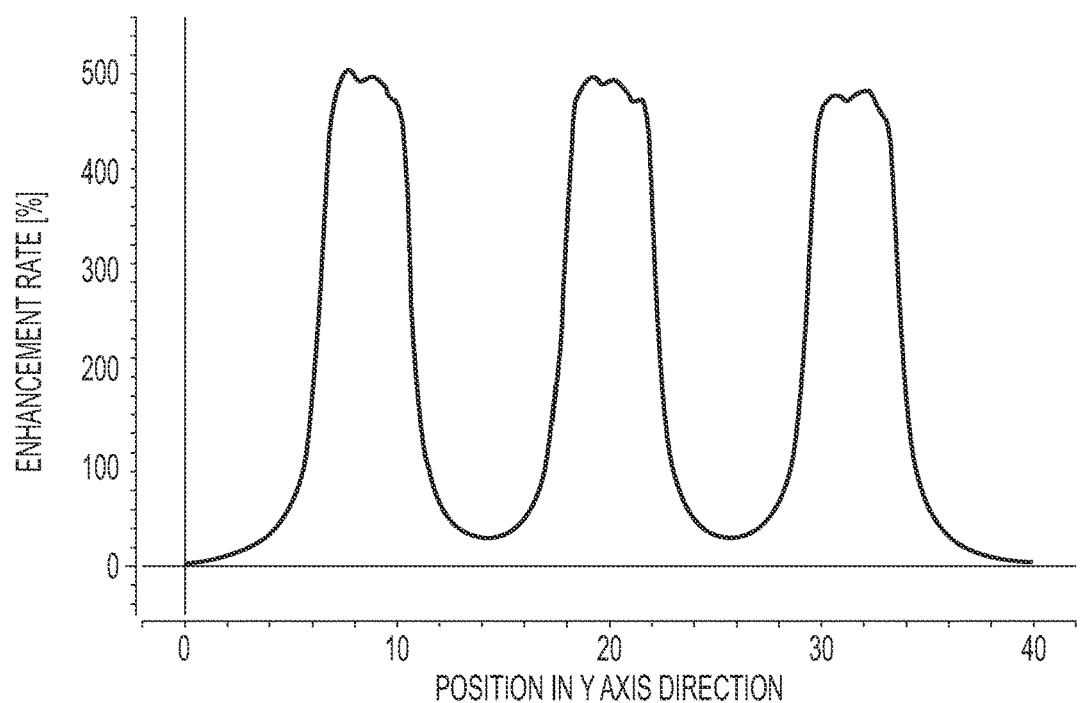
FIG. 9B is a characteristic diagram that illustrates an enhancement rate of magnetic field strength in the arrangement state of the soft magnetic bodies of the experimental example 1-2.

As illustrated in FIG. 8B, with the external magnetic field of 0.1 mT in the +Z direction being applied to the soft magnetic body 10 and the soft magnetic body 40, the magnetic field strength along a broken line illustrated in FIG. 8B was obtained, to calculate the enhancement rate. A simulation result is illustrated in FIG. 9B. In FIG. 9B, a horizontal axis denotes the position [μm] in the Y axis direction, whereas a vertical axis denotes the enhancement rate [%], i.e., the ratio of the magnetic field strength along the broken line illustrated in FIG. 8B to the magnetic field strength applied. The soft magnetic body 10 included the plate 11 and the plurality of the protrusions 12 arranged thereon. The plate 11 was rectangular parallelepiped, with the dimension in the X axis direction being 70 μm, the dimension in the Y axis direction being 40 μm, and the dimension in the Z axis direction being 5 μm. Shapes, sizes, and arrangement positions of the plurality of the protrusions 12 were the same as shapes, sizes, and arrangement positions of the plurality of the soft magnetic bodies 112 illustrated in FIG. 8A. The soft magnetic body 40 included the plate 41 and the plurality of the protrusions 42 arranged thereon. The plate 41 was rectangular parallelepiped, with the dimension in the X axis direction being 70 μm, the dimension in the Y axis direction being 40 μm, and the dimension in the Z axis direction being 5 μm. Shapes, sizes, and arrangement positions of the plurality of the protrusions 42 were the same as shapes, sizes, and arrangement positions of the plurality of the soft magnetic bodies 142 illustrated in FIG. 8A.

As illustrated in FIG. 9A, in the experimental example 1-1, the enhancement rate increased in regions between the soft magnetic bodies 112 and the soft magnetic bodies 142, with a maximum of about 200%. Meanwhile, as illustrated in FIG. 9B, in the experimental example 1-2, the enhancement rate increased in regions between the protrusions 12 and the protrusions 42, with a maximum of about 500%. Thus, it was confirmed that providing the protrusions on the plate that extended in the plane orthogonal to the direction of the magnetic field applied made it possible to locally enhance the magnetic field strength.

4.2 Experimental Examples 2-1 to 2-4

Figure 10:
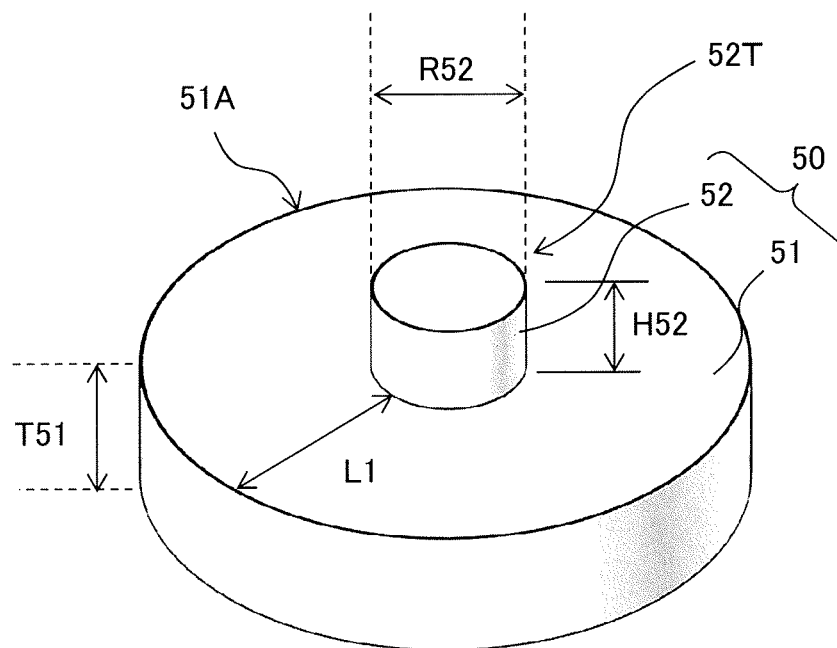
FIG. 10 schematically illustrates an external appearance of a soft magnetic body of experimental examples 2-1 to 2-4.
Figure 11:
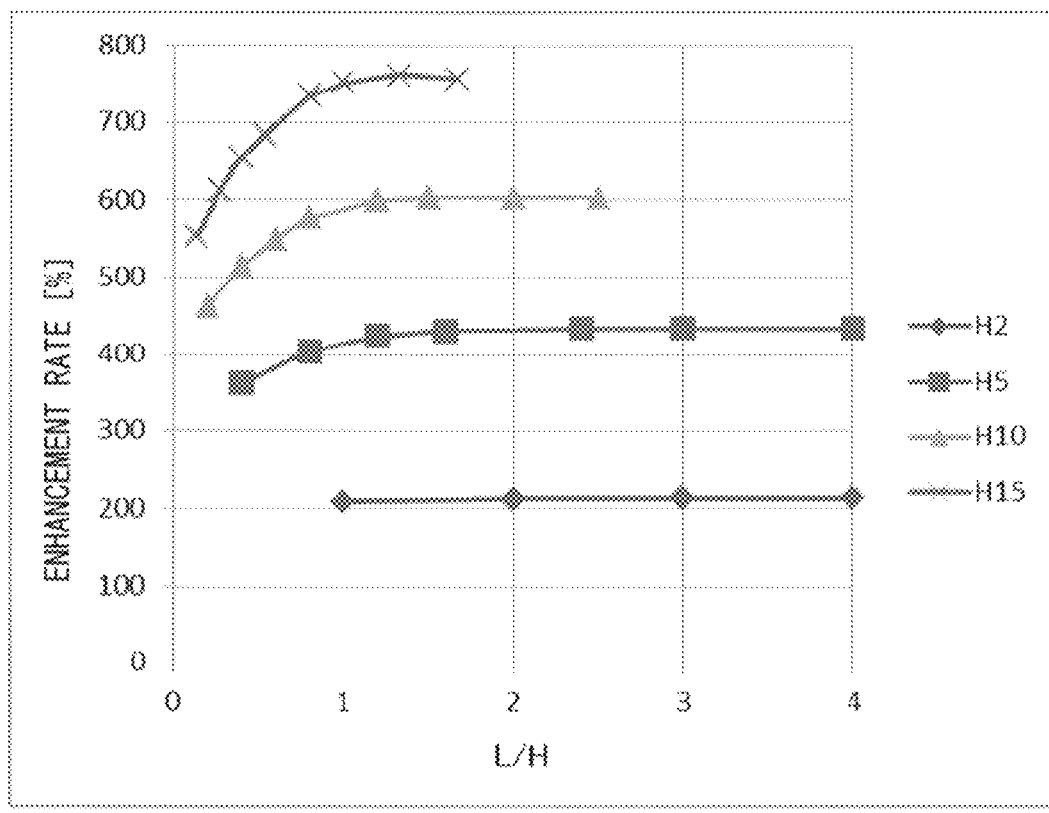
FIG. 11 is a characteristic diagram that illustrates relation between dimension ratios and enhancement rates in the soft magnetic body of the experimental examples 2-1 to 2-4.

Enhancement rates were obtained, with the external magnetic field in the +Z direction being applied to a soft magnetic body 50 as illustrated in FIG. 10. The soft magnetic body 50 included a plate 51 and a protrusion 52. The plate 51 was shaped as a disk and included an outer edge 51A. The protrusion 52 was shaped as a circular column of a diameter R52. A length from the outer edge 51A to an outer edge of the protrusion 52 was assumed to be L1 [μm]. Here, with the external magnetic field to be applied in the +Z direction being 0.1 mT, it was obtained by a simulation how many times as large as 0.1 mT magnetic field strength directly above a tip 52T (at a position of 0.5 μm) at that time was. Moreover, in an experimental example 2-1, a height H52 of the protrusion 52 was 2 μm, with a length L1 being varied in a range from 2 μm to 8 μm both inclusive. In an experimental example 2-2, the height H52 of the protrusion 52 was 5 μm, with the length L1 being varied n a range from 2 μm to 20 μm both inclusive. In an experimental example 2-3, the height H52 of the protrusion 52 was 10 μm, with the length L1 being varied in a range from 2 μm to 25 μm. In an experimental example 2-4, the height H52 of the protrusion 52 was 15 μm, with the length L1 being varied in a range from 2 μm to 25 μm. It was to be noted that a thickness T51 of the plate 51 was 1 μm, and the diameter R52 of the protrusion 52 was 2 μm. Simulation results are summarized in FIG. 11. In FIG. 11, a horizontal axis denotes a ratio of the length L1 to the height H52 of the protrusion, which is simply represented as L/H in FIG. 11. A vertical axis denotes the enhancement rate [%], i.e., the ratio of the magnetic field strength directly above the tip 52T (at the position of 0.5 μm) to the magnetic field strength applied.

From the results in FIG. 11, it was found that with the ratio L/H being 1 or more, the substantially highest enhancement rate [%] was obtained.

5. Other Modification Examples

Figure 12:
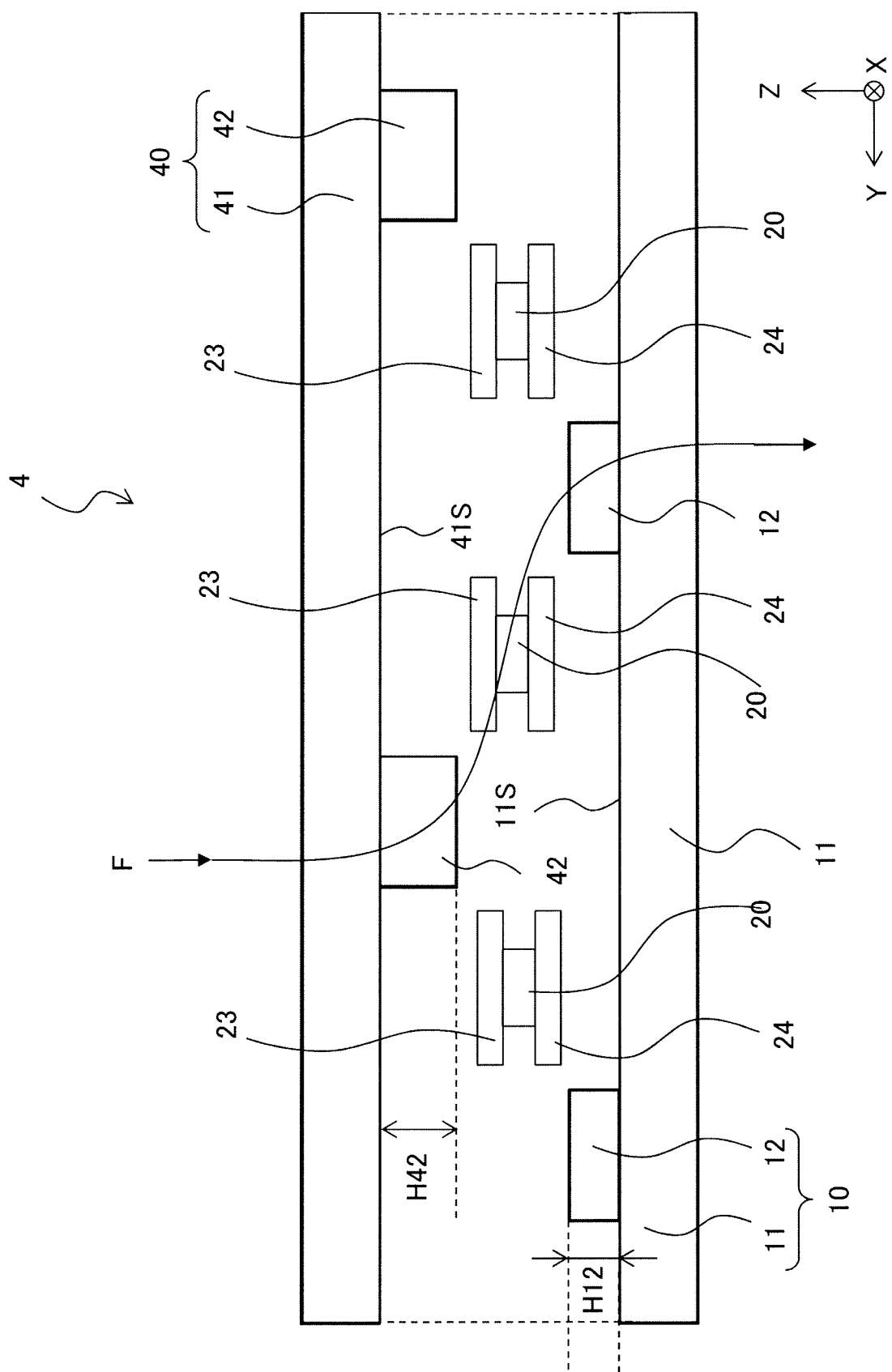
FIG. 12 is a cross-sectional view of a modification example of a magnetic field detection device according to a third modification example.

Although the invention has been described in the foregoing by way of example with reference to the example embodiments and the modification examples, the technology of the invention is not limited thereto but may be modified in a wide variety of ways. For example, in the technology of the invention, the shapes of the soft magnetic bodies are not limited to those as described in the forgoing example embodiments. For example, FIG. 12 illustrates a magnetic field detection device 4 according to a third modification example. As illustrated in FIG. 12, the pair of the soft magnetic bodies 10 and 40 may be disposed in confronted relation. The soft magnetic body 10 may include the protrusion 12, whereas the soft magnetic body 40 may include the protrusion 42. The height H12 of the protrusion 12 and the height H42 of the protrusion 42 may be different. FIG. 12 illustrates an exemplary case of H12<H42.

Figure 13:
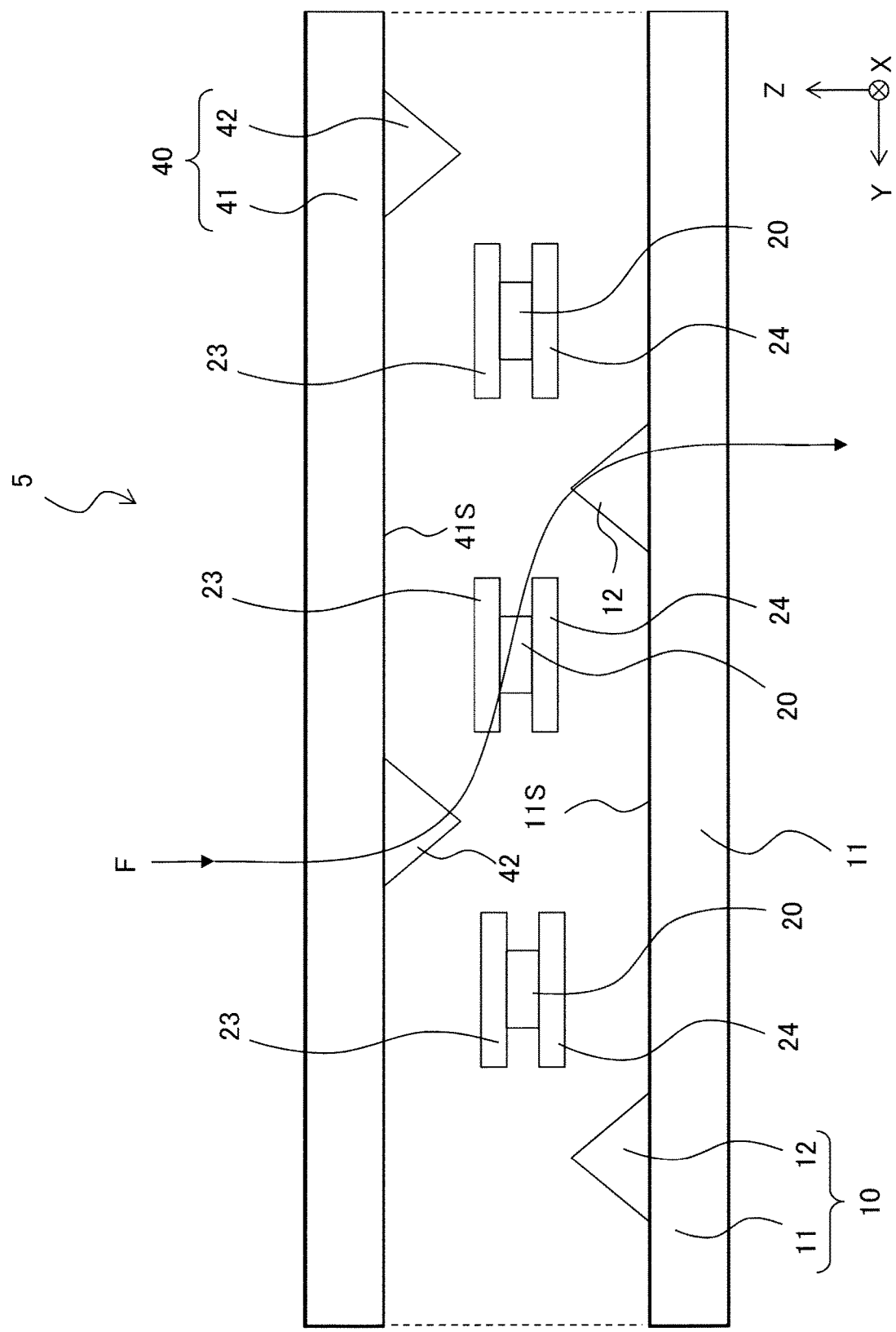
FIG. 13 is a cross-sectional view of a modification example of a magnetic field detection device according to a fourth modification example.
Figure 14:
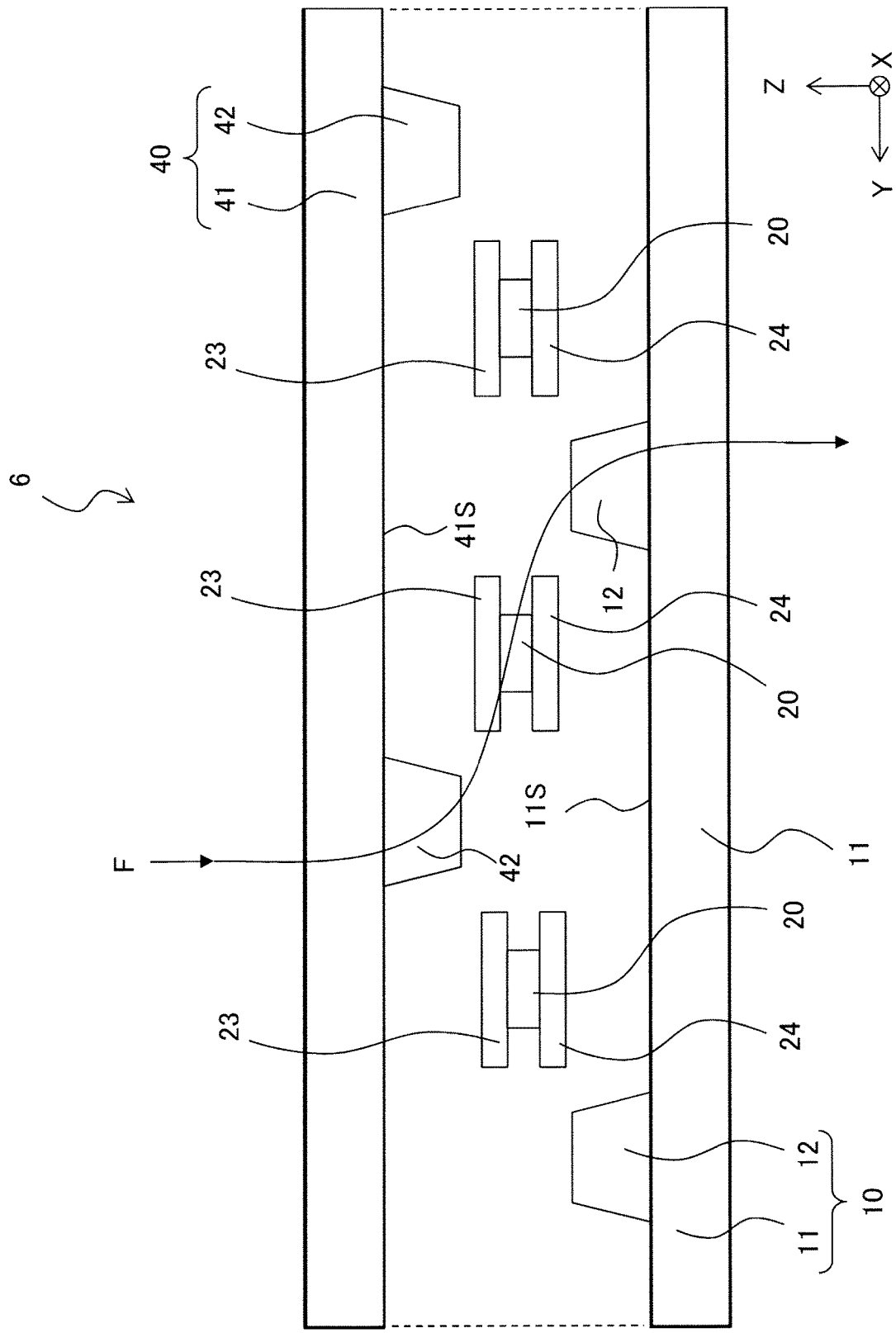
FIG. 14 is a cross-sectional view of a modification example of a magnetic field detection device according to a fifth modification example.

Moreover, the shapes of the protrusions are not limited to the substantially rectangular parallelepiped shape and the substantially circular column shape. For example, FIGS. 13 and 14 illustrate magnetic field detection devices 5 and 6 according to fourth and fifth modification examples. As illustrated in FIGS. 13 and 14, the protrusions 12 and 42 may be of a triangular cross-section or a trapezoidal cross-section.

Figure 15A:
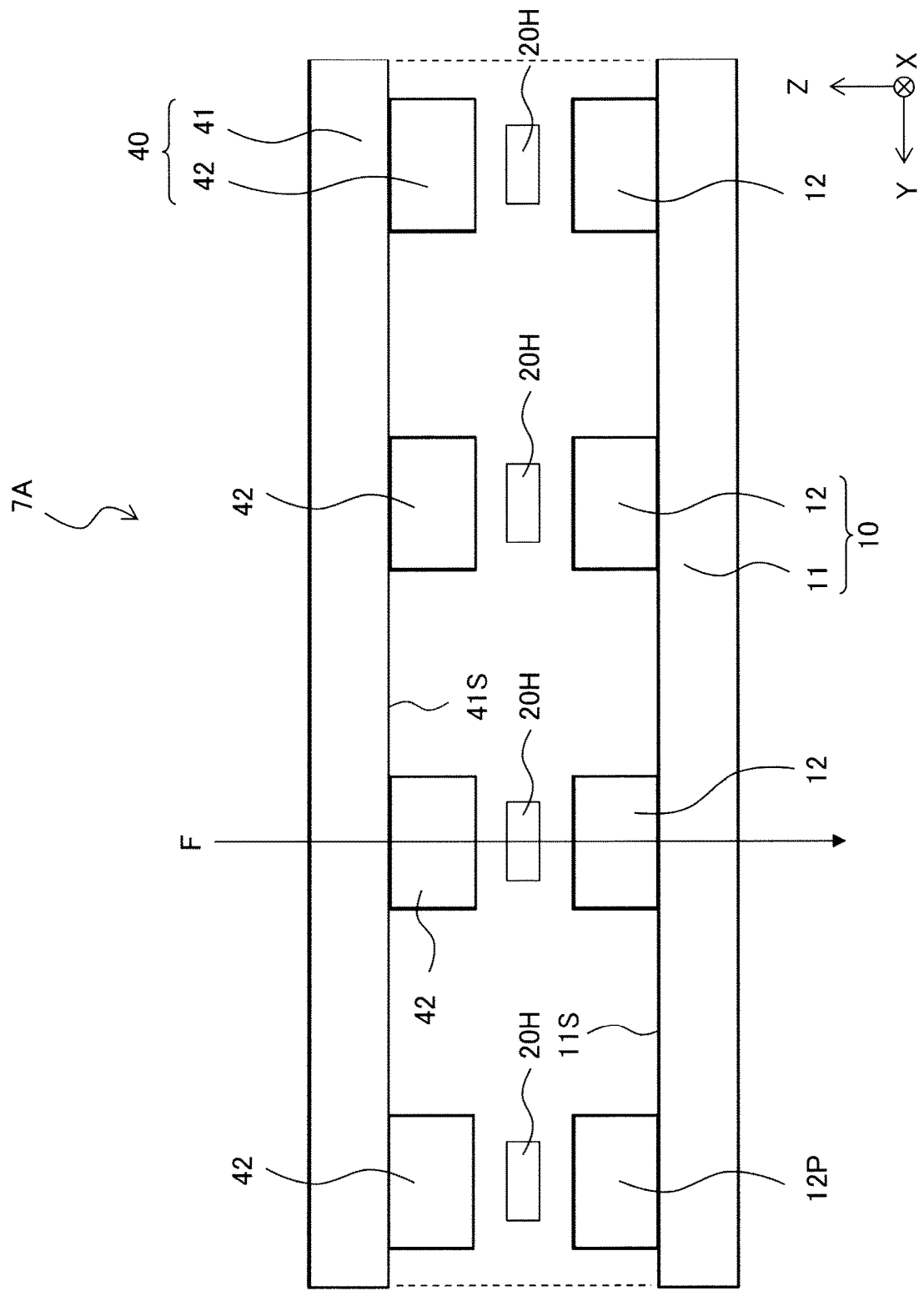
FIG. 15A is a cross-sectional view of a magnetic field detection device according to a sixth modification example.
Figure 15B:
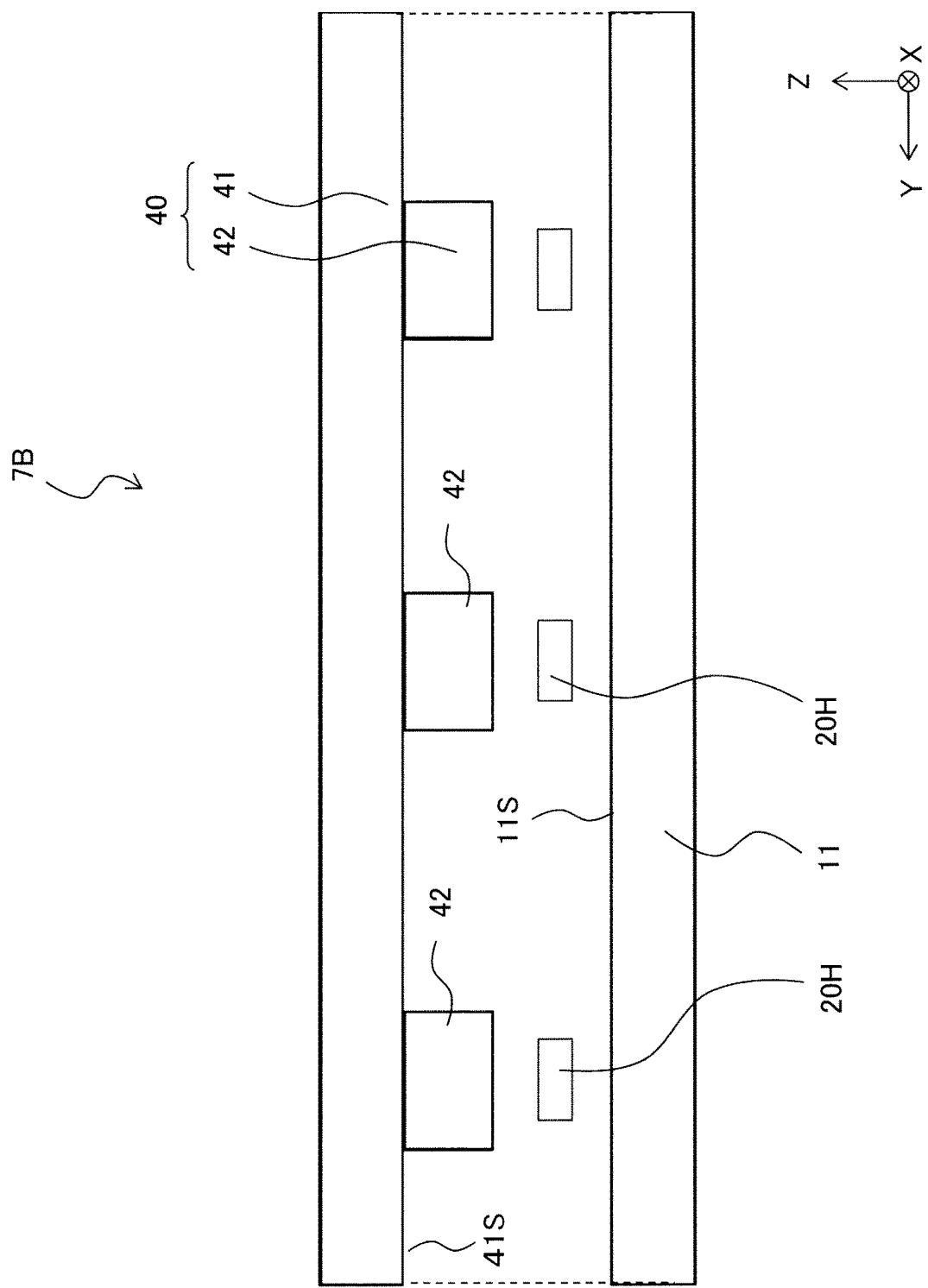
FIG. 15B is a cross-sectional view of a magnetic field detection device according to a seventh modification example.

Furthermore, in the forgoing example embodiments, description is given with exemplification of the CPP MR element having the spin valve structure, as the magnetic detector. However, the technology of the invention is not limited thereto. For example, a current in plane (CIP) MR element or an MTJ element may be used. Other sensors than the MR elements may be also used. Non-limiting examples may include a Hall element. For example, FIGS. 15A and 15B illustrate a magnetic field detection device 7A and a magnetic field detection device 7B. In a case where the Hall element is utilized as the magnetic detector, with the direction of the magnetic sensing of the Hall element being the Z axis direction, as exemplified in FIGS. 15A and 15B, the Hall element 20H may be disposed at a position superposed in the Z axis direction on the protrusion 12 or the protrusion 42. In other words, the Hall element 20H may be disposed directly above or directly below the protrusion 12 or the protrusion 42.

Figure 16A:
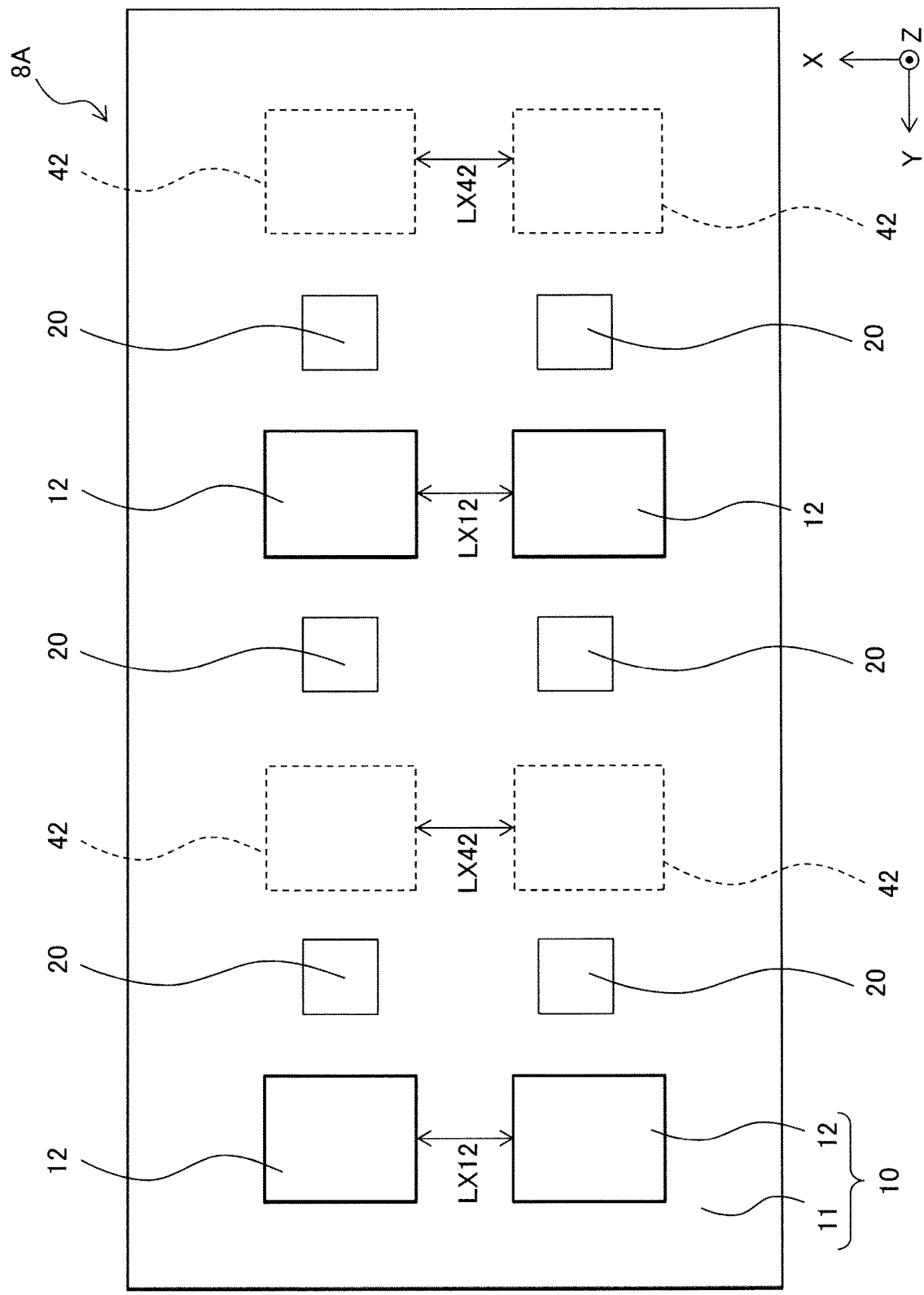
FIG. 16A is a cross-sectional view of a magnetic field detection device according to an eighth modification example.
Figure 16B:
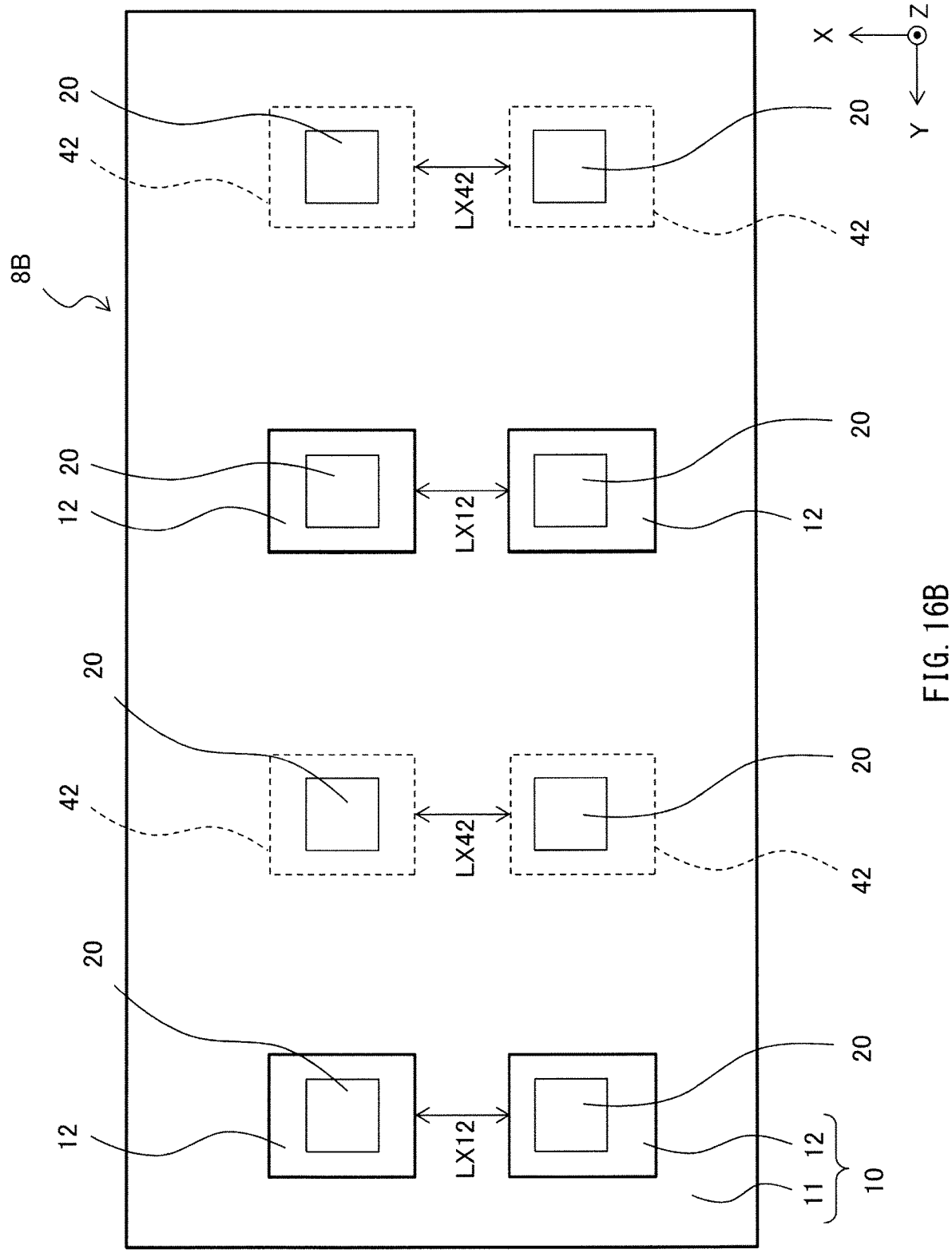
FIG. 16B is a cross-sectional view of a magnetic field detection device according to a ninth modification example.

Furthermore, in the magnetic field detection device 3 according to the forgoing third embodiment, the plurality of the magnetic detectors 20 may be arranged in a matrix in the X-Y plane, whereas the plurality of the protrusions 12 and the plurality of the protrusions 42 may be arranged in the Y axis direction. The protrusions 12 and the protrusions 42 may be of the substantially rectangular parallelepiped shape that extends in the X axis direction. However, the contents of the invention are not limited thereto. For example, FIGS. 16A and 16B illustrate a magnetic field detection device 8A and a magnetic field detection device 8B. As exemplified in FIGS. 16A and 16B, the protrusions 12 and the protrusions 42 may each be divided into a plurality, in the X axis direction as well. In other words, the protrusions 12 and the protrusions 42 may be provided at a rate of one for each of the magnetic detectors 20. In this case, in the magnetic field detection devices 8A and 8B, in one preferable but non-limiting example, an interval LX12 may be two or more times as large as the height H12 of the protrusion 12 of the soft magnetic body 10. The interval LX12 is an interval between the outer edges of the protrusions 12 in adjacency in the X axis direction. In other words, the magnetic field detection devices 8A and 8B may satisfy the following conditional expression [5], $$LX12/H12 \geq 2 \qquad [5]$$

Likewise, in one preferable but non-limiting example, an interval LX42 may be two or more times as large as the height H42 of the protrusion 42 of the soft magnetic body 40. The interval LX42 may be an interval between the outer edges of the protrusions 42 in adjacency in the X axis direction. In other words, the magnetic field detection devices 8A and 8B may satisfy the following conditional expression [6], $$LX42/H42 \geq 2 \qquad [6]$$

Moreover, the invention encompasses any possible combination of some or all of the various embodiments and the modification examples described herein and incorporated herein.

It is possible to achieve at least the following configurations from the above-described example embodiments and the modification examples of the disclosure.

(1) A magnetic field detection device, including:
a first soft magnetic body including a first plate and a first protrusion, the first plate including a first surface including a first outer edge, the first protrusion being provided at a first arrangement position in the first surface and including a first tip on opposite side to the first surface, the first arrangement position being set back from the first outer edge; and
a magnetic detector provided in vicinity of the first tip.
(2) The magnetic field detection device according to (1), in which
the following conditional expression [1] is satisfied, $$L1/H1 \geq 1 \qquad [1]$$

where L1 denotes a first length along the first surface, from the first outer edge to an edge of the first protrusion, and
H1 denotes a first height of the first tip with respect to the first surface, in a heightwise direction orthogonal to the first surface.
(3) The magnetic field detection device according to (1) or (2), in which
the first plate and the first protrusion are in contact.
(4) The magnetic field detection device according to (1) or (2), in which
the first soft magnetic body includes a non-magnetic layer between the first plate and the first protrusion.
(5) The magnetic field detection device according to any one of (1) to (4), further including a second soft magnetic body including a second plate and a second protrusion, the second plate including a second surface that includes a second outer edge and is confronted with the first surface, the second protrusion being provided at a second arrangement position in the second surface and including a second tip on opposite side to the second surface, the second arrangement position being set back from the second outer edge.

(6) The magnetic field detection device according to (5), in which
the magnetic detector is provided between the first tip and the second tip.

(7) The magnetic field detection device according to (5) or (6), in which
the following conditional expression [2] is satisfied, $$L2/H2 \geq 1 \quad [2]$$

where L2 denotes a second length along the second surface, from the second outer edge to an outer edge of the second protrusion, and
H2 denotes a second height of the second tip with respect to the second surface, in a heightwise direction orthogonal to the second surface.

(8) The magnetic field detection device according to any one of (5) to (7), in which
the first surface and the second surface are substantially parallel, and
the first arrangement position and the second arrangement position are different in an in-plane direction along the first surface and the second surface.

(9) A magnetic field detection device, including:
a first soft magnetic body including a first plate and a plurality of first protrusions, the first plate including a first surface including a first outer edge, the plurality of the first protrusions being provided at respective first arrangement positions in the first surface and including respective first tips on opposite side to the first surface, the first arrangement positions being set back from the first outer edge; and
a plurality of magnetic detectors provided in vicinity of the respective first tips of the plurality of the first protrusions.

(10) The magnetic field detection device according to (9), in which
the following conditional expression [1] and the following conditional expression [3] are satisfied, $$L1/H1 \geq 1 \quad [1]$$

$$L3/H1 \geq 2 \quad [3]$$

where L1 denotes a first length along the first surface, from the first outer edge to an outer edge of any one of the first protrusions,
L3 denotes an interval between the outer edges of the plurality of the first protrusions along a direction along the first surface, and
H1 denotes a first height of any one of the first tips with respect to the first surface, in a heightwise direction orthogonal to the first surface.

(11) The magnetic field detection device according to (9) or (10), further including a second soft magnetic body including a second plate and a plurality of second protrusions, the second plate including a second surface that includes a second outer edge and is confronted with the first surface, the plurality of the second protrusions being provided at respective second arrangement positions in the second surface and including respective second tips on opposite side to the second surface, the second arrangement positions being set back from the second outer edge.

(12) The magnetic field detection device according to (11), in which
the magnetic detectors are each provided between the first tip and the second tip.

(13) The magnetic field detection device according to (11) or (12), in which
the following conditional expression [2] and the following conditional expression [4] are satisfied, $$L2/H2 \geq 1 \quad [2]$$

$$L4/H2 \geq 2 \quad [4]$$

where L2 denotes a second length along the second surface, from the second outer edge to an outer edge of any one of the second protrusions,
L4 denotes an interval between the outer edges of the plurality of the second protrusions in a direction along the second surface, and
H2 denotes a second height of any one of the second tips with respect to the second surface, in a heightwise direction orthogonal to the second surface.

(14) The magnetic field detection device according to any one of (11) to (13), in which
the first surface and the second surface are substantially parallel, and
the first arrangement positions and the second arrangement positions are different in an in-plane direction along the first surface and the second surface.

According to a magnetic field detection device of a first illustrative embodiment of the invention, a first soft magnetic body includes a first plate and a first protrusion. A magnetic detector is provided in the vicinity of a first tip of the first protrusion. The first tip is positioned on the opposite side to a first surface. The first protrusion is provided at a first arrangement position in the first surface. The first arrangement position is set back from a first outer edge. Accordingly, a magnetic flux that comes into the first plate effectively converges on the first protrusion. This leads to high densification of the magnetic flux that reaches the magnetic detector from the first protrusion through the first tip.

According to the magnetic field detection device of the first illustrative embodiment of the invention, the following conditional expression [1] may be satisfied, $$L1/H1 \geq 1 \quad [1]$$

in which L1 denotes a first length along the first surface, from the first outer edge to an outer edge of the first protrusion, and H1 denotes a first height of the first tip with respect to the first surface, in a heightwise direction orthogonal to the first surface.

This leads to even higher densification of the magnetic flux.

According to the magnetic field detection device of the first illustrative embodiment of the invention, the plate and the protrusion may be in contact, or alternatively, the soft magnetic body may include a non-magnetic layer between the plate and the protrusion.

According to the magnetic field detection device of the first illustrative embodiment of the invention, there may be further provided a second soft magnetic body including a second plate and a second protrusion. The second plate includes a second outer edge and a second surface confronted with the first surface. The second protrusion is provided at a second arrangement position in the second surface and includes a second tip on the opposite side to the second surface. The second arrangement position is set back from the second outer edge. In this case, the magnetic detector may be provided between the first tip and the second tip. Furthermore, the following conditional expression [2] may be satisfied, $$L2/H2 \geq 1 \qquad [2]$$

in which L2 denotes a second length along the second surface, from the second outer edge to an outer edge of the second protrusion, and H2 denotes a second height of the second tip with respect to the second surface, in a heightwise direction orthogonal to the second surface.

According to the magnetic field detection device of the first illustrative embodiment of the invention, the first surface and the second surface may be substantially parallel, and the first arrangement position and the second arrangement position may be different in an in-plane direction along the first surface and the second surface.

According to a magnetic field detection device of a second illustrative embodiment of the invention, a first soft magnetic body includes a first plate and a plurality of first protrusions. The first plate includes a first surface. A plurality of magnetic detectors are provided in the vicinity of respective first tips of the plurality of the first protrusions. The first tips are provided on the opposite side to the first surface. Accordingly, a magnetic flux that comes into the first plate effectively converges on the first protrusions. This leads to high densification of the magnetic flux that reaches the magnetic detectors from the first protrusions through the first tips.

According to the magnetic field detection device of the illustrative embodiments of the invention, it is possible to enhance strength of a magnetic field as a target of detection that covers the magnetic detector or the magnetic detectors. Hence, it is possible to exhibit high performance in magnetic field detection.

Although the invention has been described in terms of exemplary embodiments, it is not limited thereto. It should be appreciated that variations may be made in the described embodiments by persons skilled in the art without departing from the scope of the invention as defined by the following claims. The limitations in the claims are to be interpreted broadly based on the language employed in the claims and not limited to examples described in this specification or during the prosecution of the application, and the examples are to be construed as non-exclusive. For example, in this disclosure, the term "preferably", "preferred" or the like is non-exclusive and means "preferably", but not limited to. The use of the terms first, second, etc. do not denote any order or importance, but rather the terms first, second, etc. are used to distinguish one element from another. The term "substantially" and its variations are defined as being largely but not necessarily wholly what is specified as understood by one of ordinary skill in the art. The term "about" or "approximately" as used herein can allow for a degree of variability in a value or range. Moreover, no element or component in this disclosure is intended to be dedicated to the public regardless of whether the element or component is explicitly recited in the following claims.

What is claimed is:

1. A magnetic field detection device, comprising:
    a first soft magnetic body comprising:
        a first plate including a first surface having a first outer edge;
        a first protrusion disposed indirectly on the first surface of the first plate at a first arrangement position set back from the first outer edge, the first protrusion including a first tip on an opposite side to the first surface; and
        a non-magnetic layer between the first plate and the first protrusion, and
    a magnetic detector provided in a vicinity of the first tip,
    wherein the magnetic detector has a magnetic sensing direction along the first surface, and
    the first protrusion is configured to bend a direction of a first magnetic flux, which comes into the first plate, along the first surface.

2. The magnetic field detection device according to claim 1, wherein the following conditional expression [1] is satisfied, $$L1/H1 \geq 1 \qquad [1]$$

where:
    L1 denotes a first length along the first surface, from the first outer edge to an edge of the first protrusion, and
    H1 denotes a first height of the first tip with respect to the first surface, in a heightwise direction orthogonal to the first surface.

3. The magnetic field detection device according to claim 1, wherein the first plate and the first protrusion are in direct contact.

4. The magnetic field detection device according to claim 1, further comprising a second soft magnetic body comprising:
    a second plate including a second surface that has a second outer edge and faces the first surface of the first plate; and
    a second protrusion disposed directly or indirectly on the second surface of the second plate at a second arrangement position set back from the second outer edge, the second protrusion including a second tip on an opposite side to the second surface.

5. The magnetic field detection device according to claim 4, wherein the second protrusion is configured to bend a direction of a second magnetic flux, which comes into the second plate, along the second surface.

6. The magnetic field detection device according to claim 4, wherein the second soft magnetic body further comprises a non-magnetic layer between the second plate and the second protrusion.

7. The magnetic field detection device according to claim 4, wherein the magnetic detector is provided between the first tip and the second tip.

8. The magnetic field detection device according to claim 4, wherein the following conditional expression [2] is satisfied, $$L2/H2 \geq 1 \qquad [2]$$

where:
- L2 denotes a second length along the second surface, from the second outer edge to an outer edge of the second protrusion, and
- H2 denotes a second height of the second tip with respect to the second surface, in a second heightwise direction orthogonal to the second surface.

9. The magnetic field detection device according to claim 4, wherein:
- the first surface and the second surface are substantially parallel, and
- the first arrangement position and the second arrangement position are different in an in-plane direction along the first surface and the second surface.

10. The magnetic field detection device according to claim 1, wherein the magnetic detector is disposed on a first tip side of the first protrusion in a heightwise direction orthogonal to the first surface.

11. The magnetic field detection device according to claim 1, wherein a width of the first protrusion is narrower than a width of the first plate in an in-plane direction along the first surface.

12. The magnetic field detection device according to claim 1, wherein the first plate extends in a length direction, a width direction, and a thickness direction,
- the thickness direction is parallel to a stacking direction of the first protrusion on the first plate, and
- the length direction and the width direction define a plane that is orthogonal to the thickness direction.

13. A magnetic field detection device, comprising:
- a first soft magnetic body comprising:
  - a first plate including a first surface having a first outer edge;
  - a plurality of first protrusions disposed indirectly on the first surface of the first plate at respective first arrangement positions set back from the first outer edge, the plurality of first protrusions including respective first tips on an opposite side to the first surface; and
  - a plurality of non-magnetic layers between the first plate and respective first protrusions, and
- a plurality of magnetic detectors provided in a vicinity of the respective first tips of the plurality of first protrusions,
- wherein each of the plurality of magnetic detectors has a magnetic sensing direction along the first surface, and
- each of the plurality of first protrusions is configured to bend a direction of a first magnetic flux, which comes into the first plate, along the first surface.

14. The magnetic field detection device according to claim 13, wherein the following conditional expression [1] and the following conditional expression [3] are satisfied, $$L1/H1 \geq 1 \quad [1]$$

$$L3/H1 \geq 2 \quad [3]$$

where:
- L1 denotes a first length along the first surface, from the first outer edge to an outer edge of any one of the first protrusions,
- L3 denotes an interval between outer edges of the plurality of first protrusions along a direction along the first-surface, and
- H1 denotes a first height of any one of the first tips with respect to the first surface, in a heightwise direction orthogonal to the first surface.

15. The magnetic field detection device according to claim 13, further comprising a second soft magnetic body comprising:
- a second plate including a second surface that has a second outer edge and faces the first surface of the first plate, and
- a plurality of second protrusions disposed directly or indirectly on the second surface of the second plate at respective second arrangement positions set back from the second outer edge, the plurality of second protrusions including respective second tips on an opposite side to the second surface.

16. The magnetic field detection device according to claim 15, wherein each of the plurality of second protrusions is configured to bend a direction of a second magnetic flux, which comes into the second plate, along the second surface.

17. The magnetic field detection device according to claim 15, wherein the second soft magnetic body further comprises a non-magnetic layer between the second plate and the second protrusion.

18. The magnetic field detection device according to claim 15, wherein the magnetic detectors are each provided between a respective first tip and a respective second tip.

19. The magnetic field detection device according to claim 15, wherein the following conditional expression [2] and the following conditional expression [4] are satisfied, $$L2/H2 \geq 1 \quad [2]$$

$$L4/H2 \geq 2 \quad [4]$$

where:
- L2 denotes a second length along the second surface, from the second outer edge to an outer edge of any one of the second protrusions,
- L4 denotes an interval between outer edges of the plurality of second protrusions in a direction along the second surface, and
- H2 denotes a second height of any one of the second tips with respect to the second surface, in a second heightwise direction orthogonal to the second surface.

20. The magnetic field detection device according to claim 15, wherein:
- the first surface and the second surface are substantially parallel, and
- the first arrangement positions and the second arrangement positions are different in an in-plane direction along the first surface and the second surface.

21. The magnetic field detection device according to claim 13, wherein the magnetic detectors are disposed on first tip sides of the first protrusions in a heightwise direction orthogonal to the first surface.

22. A magnetic field detection device, comprising:
- a first soft magnetic body comprising:
  - a first plate including a first surface having a first outer edge;
  - a first magnetic collection region disposed indirectly on the first surface of the first plate at a first arrangement position set back from the first outer edge, the first magnetic collection region including a first tip on an opposite side to the first surface; and a non-magnetic layer between the first plate and the first magnetic collection region, and a magnetic detector provided in a vicinity of the first tip, wherein the magnetic detector has a magnetic sensing direction along the first surface, and the first magnetic collection region is configured to bend a direction of a first magnetic flux, which comes into the first plate, along the first surface.

23. A magnetic field detection device, comprising:

a first soft magnetic body comprising:

- a first plate including a first surface having a first outer edge;
- a first magnetic collection region disposed indirectly on the first surface of the first plate at a first arrangement position set back from the first outer edge; and
- a non-magnetic layer between the first plate and the first magnetic collection region, and a magnetic detector provided in a magnetically affected area where the first magnetic collection region is magnetically affected, wherein the magnetic detector has a magnetic sensing direction along the first surface, and the first magnetic collection region is configured to bend a direction of a first magnetic flux, which comes into the first plate, along the first surface.

* * * * *